(12) United States Patent
Hoshino

(10) Patent No.: US 7,183,025 B2
(45) Date of Patent: Feb. 27, 2007

(54) PHASE DIFFERENCE SPECIFYING METHOD

(75) Inventor: Daigo Hoshino, Sendai (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/420,809

(22) Filed: May 30, 2006

(65) Prior Publication Data

US 2006/0275678 A1 Dec. 7, 2006

(30) Foreign Application Priority Data

Jun. 3, 2005 (JP) ............................. 2005-164371

(51) Int. Cl.
*G03C 5/00* (2006.01)
*G03F 9/00* (2006.01)
*G06K 9/00* (2006.01)

(52) U.S. Cl. ........................... 430/30; 430/5; 430/311; 430/312; 382/144

(58) Field of Classification Search .................. 430/5, 430/30, 311, 312; 382/144
See application file for complete search history.

(56) References Cited

U.S. PATENT DOCUMENTS 5,786,112 A * 7/1998 Okamoto et al. ............... 430/5
7,075,639 B2 * 7/2006 Adel et al. ............... 356/237.5

FOREIGN PATENT DOCUMENTS

JP 10-78647 A 3/1998

* cited by examiner

*Primary Examiner*—Christopher G. Young
(74) *Attorney, Agent, or Firm*—Shinjyu Global IP

(57) ABSTRACT

A phase shift mask comprises first and second mask patterns. The first mask pattern is a backing film enabling a first optical image to be formed on a substrate. The first optical image forms a resist pattern having a width that changes depending on the distance between the phase shift mask and the substrate. The second mask pattern is a semi-transmissive film enabling a second optical image to be formed on the substrate. The second optical image can form a resist pattern having a width that changes depending on the distance between the phase shift mask and the substrate and on a thickness of the semi-transmissive film. The duty ratio of the second mask is set so that the rate at which the width of the first optical image varies will be the same as the rate at which the width of the second optical image varies.

20 Claims, 19 Drawing Sheets

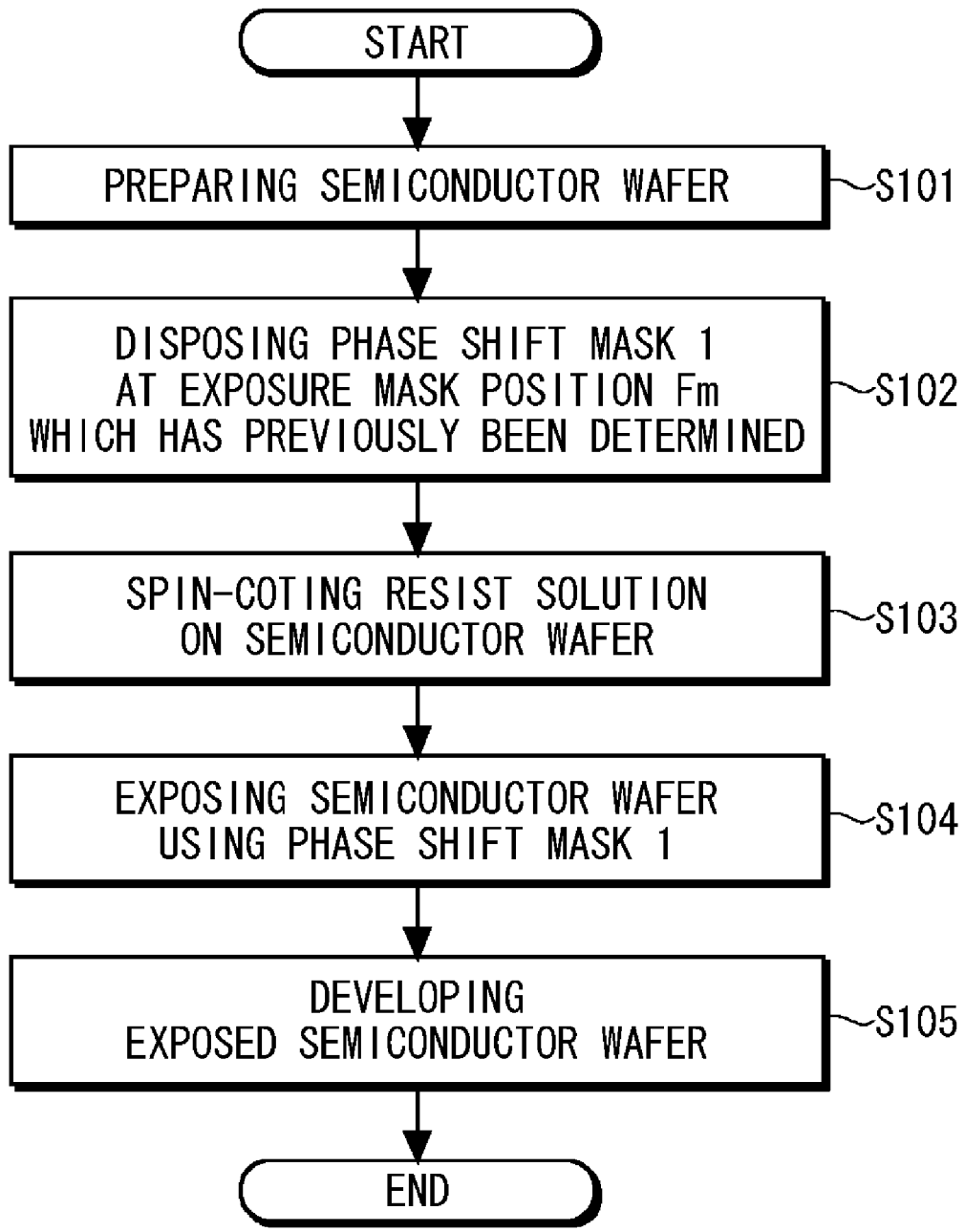

PHASE DIFFERENCE SPECIFYING METHOD

BACKGROUND OF THE INVENTION

1. Field of the Invention

The present invention relates to a phase difference specifying method, a method of manufacturing a phase shift mask, a phase shift mask, and an exposure method and a method of manufacturing a semiconductor device using a phase shift mask.

2. Background Information

Conventionally, a phase shift mask has been used as a typical photo-mask for use in a photolithographic process in manufacturing a semiconductor device. A phase shift mask is a type of mask which is capable of controlling the phase and transmissivity of light. Accordingly, compared with a chrome (Cr) mask, which is another type of conventional photo-mask, the phase shift mask has an improved printing characteristic and is capable of printing a pattern image on a semiconductor wafer in minute detail.

A typical phase shift mask has a structure in which a film (hereinafter to be referred to a phase shift film) is formed on a predetermined substrate (hereinafter to be referred to as a mask substrate). The phase shift film is made of a material having a different refractive index than the material forming the mask substrate. The phase shift film or the mask substrate has an opening. The phase shift film is arranged to have a refractive index and thickness which enable the optical path difference between the first light penetrating through the opening and the second light penetrating through the other portions thereof to become a half wavelength. In other words, the phase shift film is arranged such that the phase difference between these two lights will become 180°.

In order to measure such phase difference in the phase shift film, i.e. the phase difference between the light penetrating through the opening and the light penetrating through the other portions thereof, a phase difference measuring unit having an interference optical system is used. This phase difference measuring unit uses an inspection light having the same wavelength as an exposure light used in semiconductor device manufacturing processes. On the other hand, there is also a type of phase difference measuring unit which corrects the phase difference in the phase shift film based on the refractive index of the phase shift film with respect to the wavelengths of the exposure light and the inspection light, and therefore, uses an inspection light having a different wavelength than that of the exposure light.

With respect to a phase difference measuring method using the phase shift mask, Laid-Open Japanese Patent Application No. 10-78647 (to be referred to as patent reference 1) discloses related technology, for instance.

According to the conventional technology as disclosed in patent reference 1, a phase shift mask, having a structure in which a backing film (i.e., a chrome film) in which a number of rectangular openings are arranged at predetermined intervals, and a phase shift film in which a number of rectangular openings are arranged at predetermined intervals are formed on the same mask substrate, is used to perform a process of printing an optical image on a predetermined substrate multiple times from different positions in the direction of the optical axis. Then, based on upper and lower limits of the image intensity of the obtained multiple optical images, an amount of focus shift is calculated, and based on the calculated focus shift amount, a phase difference is calculated.

However, one problem with the conventional phase difference measuring method that uses the phase shift mask is that the method requires an expensive measuring unit for exclusive use in measuring optical images. Furthermore, according to the phase difference measuring method disclosed in patent reference 1, the mask position at the time of exposure has to be shifted multiple times in the direction of the optical axis to obtain multiple optical images, which makes the whole process complicated. In addition, when measuring the phase difference using an inspection light having a different wavelength from that of the actual exposure light, it is difficult to correct the phase difference with good precision because of distribution differences in refractive index within the shift film, especially under the conventional method, and therefore the correction result might be greatly influenced by the former possible measurement errors.

In view of the above, it will be apparent to those skilled in the art from this disclosure that there exists a need for an improved phase difference specifying method, an improved method of manufacturing a phase shift mask, an improved phase shift mask, and an improved exposure method and an improved method of manufacturing a semiconductor device using a phase shift mask. This invention addresses this need in the art as well as other needs, which will become apparent to those skilled in the art from this disclosure.

SUMMARY OF THE INVENTION

It is therefore an object of the present invention to resolve the above-described problems and to provide a phase difference specifying method which allows for a phase difference to be easily specified with good precision and without the need for an expensive measuring unit. It is another object of the present invention to provide a phase shift mask and a method of manufacturing a phase shift mask that achieves a phase difference specifying method in which a phase difference can be easily specified with good precision. It is yet another object of the present invention to provide an exposure method and a method of manufacturing a semiconductor device which uses a phase shift mask suitable for specifying the phase difference thereof with good precision.

In accordance with a first aspect of the present invention, a phase difference specifying method comprises the steps of: preparing a phase shift mask having a first mask pattern and a second mask pattern, the first mask pattern comprising a backing film having a first shape which enables a first optical image to be formed on a predetermined substrate that is a target of exposure, the first optical image capable of forming a first resist pattern having a first width that changes depending on the distance from the predetermined substrate, the second mask pattern comprising a semi-transmissive film having a second shape which enables a second optical image to be formed on the predetermined substrate, the second optical image capable of forming a second resist pattern having a second width that changes depending on the distance from the predetermined substrate and on a thickness of the semi-transmissive film, the first mask pattern and the second mask pattern being separated from each other by a first interval; forming the first and second resist patterns on the predetermined substrate by exposing the predetermined substrate through the phase shift mask, the phase shift mask being arranged at a first position on a predetermined optical axis separated from the predetermined substrate by a first distance; obtaining the difference between the first width of the first resist pattern and the second width of the second resist pattern; and obtaining the difference between the phases of a first light passing through the phase shift mask except for regions where the first and second mask patterns are formed and a second light passing through the second mask pattern, based on the width difference between the first resist pattern and the second resist pattern.

In accordance with a second aspect of the present invention, the phase difference specifying method according to the first aspect, wherein the first position is a position on the predetermined optical axis separated from a second position by a second distance, the second position being a position where the first and second optical images are formed on the predetermined substrate in focus.

In accordance with a third aspect of the present invention, the phase difference specifying method according to the first aspect, wherein the phase difference between the first light and the second light is specified by using a correspondence relationship between the width difference and the phase difference which is registered in advance.

In accordance with a fourth aspect of the present invention, the phase difference specifying method according to the first aspect, wherein at least two combinations of the first and second resist patterns are formed on the predetermined substrate, a width direction of the first resist patterns being the same as a width direction of the second resist patterns, and the width difference is calculated based on the center between an exterior edge of one first resist pattern and an exterior edge of one second resist pattern and the center between an interior edge of the other first resist pattern and an interior edge of the other second resist pattern, one first resist pattern being located at one external side in the width direction, the other first resist pattern being located at an internal side in the width direction, one second resist pattern being located at the other external side in the width direction, and the other second resist pattern located at an internal side in the width direction.

In accordance with a fifth aspect of the present invention, the phase difference specifying method according to the first aspect, wherein the phase shift mask has at least two combinations of the first and second mask patterns, the combinations having a second interval therebetween, and the width direction of the first and second mask patterns in one combination is the same as the width direction of the first and second mask patterns in the other combination.

In accordance with a sixth aspect of the present invention, the phase difference specifying method according to the first aspect, wherein the first and second shapes are line-and-space patterns.

In accordance with a seventh aspect of the present invention, the phase difference specifying method according to the first aspect, wherein a duty ratio of the second shape is set so that a change in the width of the first optical image with respect to the first distance will be equal to a change in the width of the second optical image with respect to the change of the first distance when the thickness of the semi-transmission film is set so that the phase difference becomes 180°.

In accordance with an eighth aspect of the present invention, the phase difference specifying method according to the first aspect, wherein the backing film is made of chrome.

In accordance with a ninth aspect of the present invention, the phase difference specifying method according to the first aspect, wherein the semi-transmissive film is a chromium oxide film, a molybdenum silicide oxide film, or a multilayer film including at least one of a chromium oxide film and a molybdenum silicide oxide film.

In accordance with a tenth aspect of the present invention, the phase difference specifying method according to the first aspect, wherein the second mask pattern is a Levenson type phase shift mask.

In accordance with an eleventh aspect of the present invention, a phase difference specifying method comprises the steps of: preparing a phase shift mask having a mask pattern comprising a semi-transmissive film having a shape which enables an optical image to be formed on a predetermined substrate that is a target of exposure, the optical image capable of forming a resist pattern having a width that changes depending on a distance from the predetermined substrate; forming a first resist pattern on the predetermined substrate by exposing the predetermined substrate through the phase shift mask, the phase shift mask being arranged at a first position on a predetermined optical axis separated from the predetermined substrate by a first distance; forming a second resist pattern on the predetermined substrate by exposing the predetermined substrate through the phase shift mask, the phase shift mask being arranged at a second position which is separated from the predetermined optical axis by a first interval in a direction perpendicular to the predetermined optical axis and from the predetermined substrate by a second distance; obtaining the difference between the first width of the first resist pattern and the second width of the second resist pattern; and obtaining the difference between the phases of a first light passing through the phase shift mask except for regions where the mask pattern is formed and a second light passing through the mask pattern, based on the width difference between the first resist pattern and the second resist pattern.

In accordance with a twelfth aspect of the present invention, the phase difference specifying method according to the eleventh aspect, wherein the first position is a position on the predetermined optical axis separated from a third position by a third distance, the third position being a position where the optical images are formed on the predetermined substrate in focus, and the second position is a position on the predetermined optical axis separated from the third position by the third distance, the third position existing between the first and second positions.

In accordance with a thirteenth aspect of the present invention, the phase difference specifying method according to the eleventh aspect, wherein the phase difference between the first light and the second light is specified by using a correspondence relationship between the width difference and the phase difference which is registered in advance.

In accordance with a fourteenth aspect of the present invention, the phase difference specifying method according to the eleventh aspect, wherein at least two combinations of the first and second resist pattern are formed on the predetermined substrate, a width direction of the first resist patterns being the same as a width direction of the second resist patterns, and the width difference is calculated based on the center between an exterior edge of one first resist pattern and an exterior edge of one second resist pattern and the center between an interior edge of the other first resist pattern and an interior edge of the other second resist pattern, one first resist pattern being located at one external side in the width direction, the other first resist pattern being located at an internal side in the width direction, one second resist pattern being located at the other external side in the width direction, and the other second resist pattern located at an internal side in the width direction.

In accordance with a fifteenth aspect of the present invention, the phase difference specifying method according to the eleventh aspect, wherein the phase shift mask has at least two mask patterns which have a second interval there between, and a width direction of one mask pattern is the same as a width direction of the other mask pattern.

In accordance with a sixteenth aspect of the present invention, the phase difference specifying method according to the eleventh aspect, wherein the shape of the mask pattern is a line-and-space pattern.

In accordance with a seventeenth aspect of the present invention, the phase difference specifying method according to the eleventh aspect, wherein the semi-transmissive film is a chromium oxide film, a molybdenum silicide oxide film, or a multilayer film including at least one of a chromium oxide film and a molybdenum silicide oxide film.

In accordance with a eighteenth aspect of the present invention, the phase difference specifying method according to the eleventh aspect, wherein the phase shift mask has a backing film which is larger than the mask pattern formed on a position separated from the mask pattern by the first interval in a direction perpendicular to the predetermined optical axis, and the shadow of the backing film covers the first resist pattern formed on the predetermined substrate when forming the second resist pattern.

In accordance with a nineteenth aspect of the present invention, the phase difference specifying method according to the eighteenth aspect, wherein the backing film is made of chrome.

In accordance with a twentieth aspect of the present invention, the phase difference specifying method according to the eleventh aspect, wherein the mask pattern is a Levenson type phase shift mask.

In accordance with a twenty first aspect of the present invention, a method of forming a phase shift mask comprises the steps of: preparing an predetermined substrate; forming a semi-transmissive film on the predetermined substrate; forming a backing film on the semi-transmissive film; processing two first regions of the backing film into first shapes each of which enables a first optical image to be formed on a predetermined substrate that is a target of exposure while removing the backing film except for the first regions, each first optical image capable of forming a resist pattern having a width that changes depending on a distance from the predetermined substrate, one first region being separated from the other first region by a first interval; and processing two second regions of the semi-transmissive film into second shapes each of which enables a second optical image to be formed on the predetermined substrate while removing the semi-transmissive film except for the first and second regions, the second optical image capable of forming a resist pattern having a width that changes depending on the distance from the predetermined substrate, the second regions respectively being separated from the first regions by a second interval, one second region being separated from the other second region by the first interval.

In accordance with a twenty second aspect of the present invention, a method of forming a phase shift mask comprises the steps of: preparing an predetermined substrate; forming first films on two first regions of the predetermined substrate, each first film having a pattern which enables a first optical image to be formed on the predetermined substrate being a target of exposure, the first optical image capable of forming a first resist pattern having a first width that changes depending on a distance from the predetermined substrate, one first region being separated from the other first region by a first interval; forming second films on two second regions of the predetermined substrate, each second film having a line-and-space pattern which enables a second optical image to be formed on the predetermined substrate, the second optical image capable of forming a second resist pattern having a second width that changes depending on the distance from the predetermined substrate, the second regions respectively being separated from the first regions by a second interval, one second region being separated from the other second region by the first interval, the line-and space pattern having two or more line patterns; and forming a trench having a predetermined depth by curving the predetermined substrate that is exposed between the line patterns in the second films or forming a semi-transmissive film on the predetermined substrate that is exposed between the line patterns in the second films.

In accordance with a twenty third aspect of the present invention, a method of forming a phase shift mask comprises the steps of: preparing an predetermined substrate; forming a semi-transmissive film on the predetermined substrate; forming a backing film on the semi-transmissive film; processing one or more first regions in the backing film into one or more first shapes while removing the backing film except for the first regions; and processing one or more second regions in the semi-transmissive film into second shapes while removing the semi-transmissive film except for the first and second regions, each second shapes enabling a first optical image to be formed on the predetermined substrate that is a target of exposure, each first optical image capable of forming a resist pattern having a width that changes depending on the distance from the predetermined substrate, each second shape being smaller than the first shape, each second region being separated from the first regions by a first interval.

In accordance with a twenty fourth aspect of the present invention, the method of forming a phase shift mask according to the twenty third aspect, wherein one first region is separated from the other first region by a second interval, and the second regions respectively are separated from the first regions by the first interval.

In accordance with a twenty fifth aspect of the present invention, a method of forming a phase shift mask comprises the steps of: preparing a predetermined substrate; forming first films on two first regions of the predetermined substrate; forming line-and-space patterns on two second regions of the predetermined substrate, the second region being separated from the first region by a first interval, each line-and-space pattern being smaller than the first film, the line and space pattern having two or more line patterns; and forming a trench having a predetermined depth by curving the predetermined substrate exposed between the line patterns of the line-and-space pattern or forming a semi-transmissive film on the optically-transmissive substrate exposed between the line patterns of the line-and-space pattern.

In accordance with a twenty sixth aspect of the present invention, a phase shift mask comprises a first mask pattern comprising a backing film having a first shape which enables a first optical image to be formed on a predetermined substrate being a target of exposure, the first optical image capable of forming a first resist pattern having a first width that changes depending on a distance from the predetermined substrate, and a second mask pattern comprising a semi-transmissive film having a second shape which enables a second optical image to be formed on the predetermined substrate, the second optical image capable of forming a second resist pattern having a second width that changes depending on the distance from the predetermined substrate and on a thickness of the semi-transmissive film, the first mask pattern being separated from the second mask pattern by a first interval, and a duty ratio of the second shape is set so that a change in the width of the first optical image with respect to the first distance will be equal to a change in the width of the second optical image with respect to the change of the first distance when the thickness of the semi-transmission film is set so that the phase difference becomes 180°.

In accordance with a twenty seventh aspect of the present invention, the phase shift mask according to the twenty sixth aspect, wherein the phase difference is obtained based on a width difference between first and second resist patterns formed on the predetermined substrate by exposing the predetermined substrate through the phase shift mask, the phase shift mask being arranged at a position on a predetermined optical axis separated from the predetermined substrate by a first distance.

In accordance with a twenty eighth aspect of the present invention, the phase shift mask according to the twenty sixth aspect, wherein the phase shift mask has at least two combinations of the first and second mask patterns, the combinations having a second interval there between, and the width direction of the first and second mask patterns in one combination is the same as the width direction of the first and second mask patterns in the other combination.

In accordance with a twenty ninth aspect of the present invention, the phase shift mask according to the twenty sixth aspect, wherein the first and second shapes are line-and-space patterns.

In accordance with a thirtieth aspect of the present invention, the phase shift mask according to the twenty sixth aspect, wherein the backing film is made of chrome.

In accordance with a thirty first aspect of the present invention, the phase shift mask according to the twenty sixth aspect, wherein the semi-transmissive film is a chromium oxide film, a molybdenum silicide oxide film, or a multilayer film including at least one of a chromium oxide film and a molybdenum silicide oxide film.

In accordance with a thirty second aspect of the present invention, the phase shift mask according to the twenty sixth aspect, wherein the second mask pattern is a Levenson type phase shift mask.

In accordance with a thirty third aspect of the present invention, a phase shift mask comprises a light interception pattern comprising a backing film having a first shape, and a mask pattern comprising a semi-transmissive film having a second shape which enables an optical image to be formed on the predetermined substrate that is a target of exposure, the optical image capable of forming a resist pattern having a width that changes depending on the distance from the predetermined substrate, the second shape being smaller than the first shape, the mask pattern being separated from the light interception pattern by a first interval.

In accordance with a thirty fourth aspect of the present invention, the phase shift mask according to the thirtieth third aspect, wherein the phase difference is obtained based on a width difference between first and second resist patterns formed on the predetermined substrate by exposing the predetermined substrate through the phase shift mask, the first resist pattern being formed by exposing the predetermined substrate through the phase shift mask being arranged at a first position on a predetermined optical axis separated from the predetermined substrate by a first distance, the second resist pattern being formed by exposing the predetermined substrate through the phase shift mask being arranged at a second position which is separated from the predetermined optical axis by a first interval in a direction perpendicular to the predetermined optical axis and from the predetermined substrate by a second distance.

In accordance with a thirty fifth aspect of the present invention, the phase shift mask according to the thirtieth third aspect, wherein the phase shift mask has at least two combinations of the light interception pattern and the mask pattern, the combinations having a second interval there between, and the width direction of the light interception pattern and the mask pattern in one combination is the same as the width direction of the light interception pattern and the mask pattern in the other combination.

In accordance with a thirty sixth aspect of the present invention, the phase shift mask according to the thirtieth third aspect, wherein the mask pattern has a line-and-space pattern.

In accordance with a thirty seventh aspect of the present invention, the phase shift mask according to the thirtieth third aspect, wherein the backing film is made of chrome.

In accordance with a thirty eighth aspect of the present invention, the phase shift mask according to the thirtieth third aspect, wherein the semi-transmissive film is a chromium oxide film, a molybdenum silicide oxide film, or a multilayer film including at least one of a chromium oxide film and a molybdenum silicide oxide film.

In accordance with a thirty ninth aspect of the present invention, the phase shift mask according to the thirtieth third aspect, wherein the mask pattern is a Levenson type phase shift mask.

In accordance with a fortieth aspect of the present invention, an exposure method comprises the steps of: preparing a phase shift mask having a first mask pattern and a second mask pattern, the first mask pattern comprising a backing film having a first shape which enables a first optical image to be formed on a predetermined substrate that is a target of exposure, the first optical image capable of forming a first resist pattern having a first width that changes depending on the distance from the predetermined substrate, the second mask pattern comprising a semi-transmissive film having a second shape which enables a second optical image to be formed on the predetermined substrate, the second optical image capable of forming a second resist pattern having a second width that changes depending on the distance from the predetermined substrate and on the thickness of the semi-transmissive film, the first mask pattern being separated from the second mask pattern by a first interval, the phase difference being obtained based on a width difference between first and second resist patterns formed on the predetermined substrate by exposing the predetermined substrate through the phase shift mask, the phase shift mask being arranged at a position on a predetermined optical axis separated from the predetermined substrate by a first distance; preparing a semiconductor substrate having a resist solution applied to a predetermined surface thereof, and exposing the predetermined surface of the semiconductor substrate through the phase shift mask.

In accordance with a forty first aspect of the present invention, an exposure method comprises the steps of: preparing a phase shift mask having a mask pattern comprising a semi-transmissive film having a second shape which enables an optical image to be formed on the predetermined substrate that is a target of exposure, the optical image capable of forming a resist pattern having a width that changes depending on the distance from the predetermined substrate, the second shape being smaller than the first shape, the mask pattern being separated from the light interception pattern by a first interval, the phase difference being obtained based on a width difference between first and second resist patterns formed on the predetermined substrate by exposing the predetermined substrate through the phase shift mask, the phase shift mask being arranged at a position on a predetermined optical axis separated from the predetermined substrate by a first distance, the first resist pattern formed on the predetermined substrate by exposing the predetermined substrate through the phase shift mask arranged at a first position on a predetermined optical axis separated from the predetermined substrate by a first distance, the second resist pattern formed on the predetermined substrate by exposing the predetermined substrate through the phase shift mask arranged at a second position which is separated from the predetermined optical axis by a first interval in a direction perpendicular to the predetermined optical axis and from the predetermined substrate by a second distance; preparing a semiconductor substrate having a resist solution applied to a predetermined surface thereof; and exposing the predetermined surface of the semiconductor substrate through the phase shift mask.

In accordance with a forty second aspect of the present invention, an exposure method comprises the steps of: preparing a phase shift mask having a first mask pattern and a second mask pattern, the first mask pattern comprising a backing film having a first shape which enables a first optical image to be formed on a predetermined substrate that is a target of exposure, the first optical image capable of forming a first resist pattern having a first width that changes depending on a distance from the predetermined substrate, the second mask pattern comprising a semi-transmissive film having a second shape which enables a second optical image to be formed on the predetermined substrate, the second optical image capable of forming a second resist pattern having a second width that changes depending on the distance from the predetermined substrate and on the thickness of the semi-transmissive film, the first mask pattern being separated from the second mask pattern by a first interval, the phase difference being obtained based on a width difference between first and second resist patterns formed on the predetermined substrate by exposing the predetermined substrate through the phase shift mask, the phase shift mask being arranged at a position on a predetermined optical axis separated from the predetermined substrate by a first distance; preparing a semiconductor substrate; and forming a resist pattern on a predetermined surface of the semiconductor substrate by exposing the predetermined surface through the phase shift mask.

In accordance with a forty third aspect of the present invention, an exposure method comprises the steps of: preparing a phase shift mask having a mask pattern being a semi-transmissive film having a second shape which enables an optical image to be formed on the predetermined substrate that is a target of exposure, the optical image capable of forming a resist pattern having a width that changes depending on the distance from the predetermined substrate, the second shape being smaller than the first shape, the mask pattern being separated from the light interception pattern by a first interval, the phase difference being obtained based on a width difference between first and second resist patterns formed on the predetermined substrate by exposing the predetermined substrate through the phase shift mask, the phase shift mask being arranged at a position on a predetermined optical axis separated from the predetermined substrate by a first distance, the first resist pattern being formed on the predetermined substrate by exposing the predetermined substrate through the phase shift mask arranged at a first position on a predetermined optical axis separated from the predetermined substrate by a first distance, the second resist pattern being formed on the predetermined substrate by exposing the predetermined substrate through the phase shift mask arranged at a second position which is separated from the predetermined optical axis by a first interval in a direction perpendicular to the predetermined optical axis and from the predetermined substrate by a second distance; preparing a semiconductor substrate; and forming a resist pattern on a predetermined surface of the semiconductor substrate by exposing the predetermined surface through the phase shift mask.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 8 is a flow chart showing processes of manufacturing a semiconductor device which include exposure processes using the phase shift mask according to the first embodiment of the present invention;

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Embodiment 1

First, a first embodiment of the present invention will be described in detail with reference to the drawings.

Structure of Phase Shift Mask 1

Figure 1A:
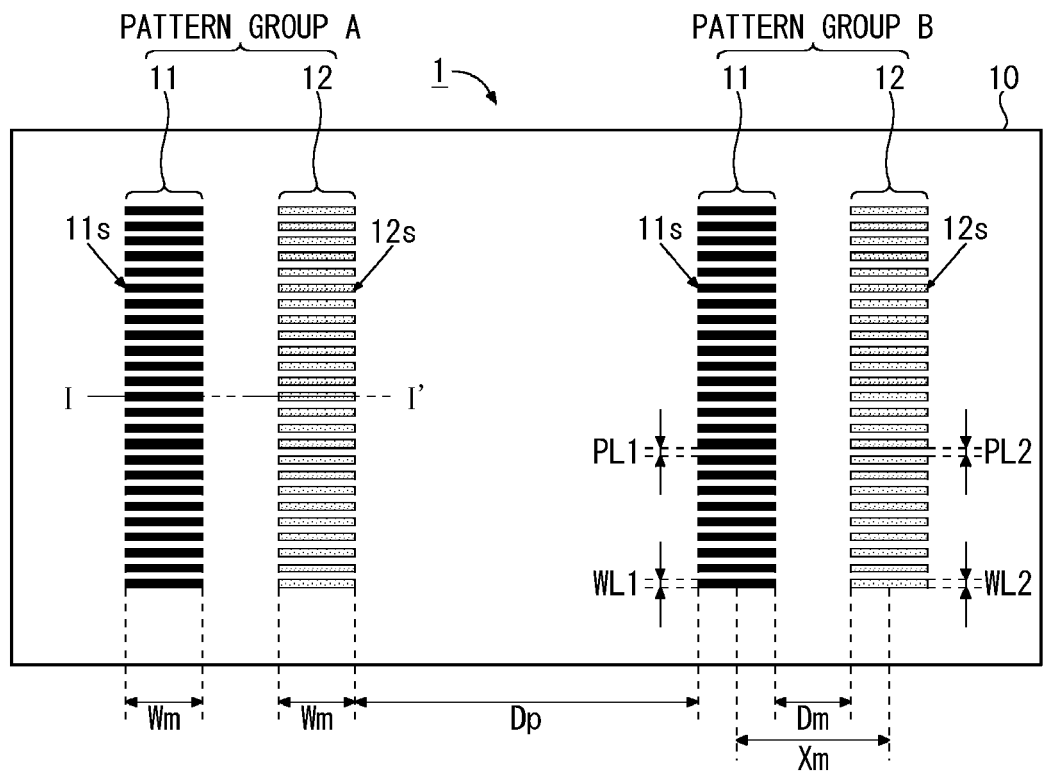
FIG. 1A is a plan view of the structure of a phase shift mask according to a first embodiment of the present invention.
Figure 1B:
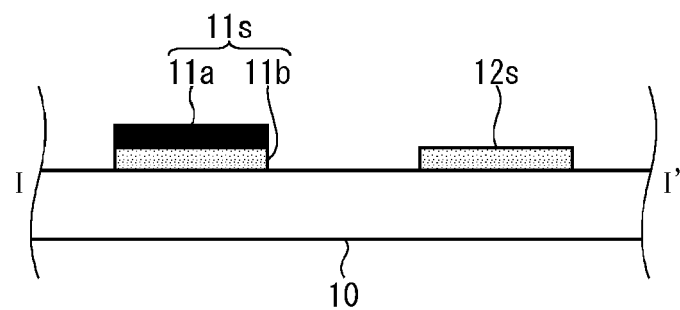
FIG. 1B is a sectional view of the structure of the phase shift mask according to the first embodiment of the present invention taken along a line I–I' shown in FIG. 1A.

FIG. 1A is a plan view of the structure of a phase shift mask 1 according to a first embodiment of the present invention. FIG. 1B is a sectional view of the structure of the phase shift mask 1 taken along a line I–I' shown in FIG. 1A. Here, the phase shift mask 1 is used while an upper surface thereof shown in FIG. 1B is facing one side of a predetermined substrate that serves as an exposure target.

As shown in FIG. 1A, the phase shift mask 1 has two or more pattern groups (q.v. pattern groups A and B in FIG. 1A) formed on a mask substrate 10, each pattern group including a first mask pattern 11 which is a backing film and a second mask pattern 12 which is a semi-transmissive film (also called a half-tone film). The pattern groups are arranged at predetermined intervals Dp.

In the above structure, the mask substrate 10 is a type of substrate which is translucent with respect to an exposure light or an inspection light (hereinafter to be referred to simply as light). As for the mask substrate 10, it is possible to apply a glass substrate made of synthetic quartz, for instance. Furthermore, if a 6-inch reticle, which is commonly used in processes like KrF excimer laser lithography and i ray lithography, is used here, for instance, the mask substrate can be made to a thickness of 6.35 mm (millimeters), for instance. It should be noted, however, that these conditions of the mask substrate are not limiting conditions, and various types of substrates made of various materials with different thicknesses are possible options for the mask substrate.

The first mask pattern 11 is a light interception pattern. As shown in FIG. 1A, the first mask pattern 11 has a structure in which multiple line patterns (hereinafter to be referred to as line patterns 11s) each of which being Wm in length and WL1 in width are arranged periodically at predetermined intervals PL1. In other words, the size of the first mask pattern 11 can be measured as Wm in width and (width WL1+predetermined interval PL1)×(number of line patterns 11s) in length. Hereinafter, such periodic structure will be referred to as a line-and-space pattern. As shown in FIG. 1B, a sectional structure of each individual line pattern 11s has a half-tone film 11b and a backing film 11a laminated sequentially on the mask substrate 10. However, the line pattern may be varied in many possible ways as long as it has a structure which can intercept lights. For instance, it is possible to apply a structure in which only a backing film 11a is formed on the mask substrate 10.

The backing film 11a may be a chrome (Cr) film, for instance. However, any type of film can be applied as the backing film as long as it is a film made of a material which is nontransparent with respect to light. The following description will describe a situation in which a chrome (Cr) film is used as the backing film 11a. The backing film 11a can be made to a thickness of about 100 μm (micrometers) when a light wavelength is made to be 248 nm (nanometers) by employing KrF excimer laser lithography, for instance. However, the backing film may also have a different thickness.

The half-tone film 11b may be a chrome oxide ($CrO_2$) film, an oxide film of molybdenum silicide (MoSi), a multilayer film including a chrome oxide film or an oxide film of molybdenum silicide, or the like. The following description will describe a situation in which a chrome oxide ($CrO_2$) film is used as the half-tone film. The thickness of the half-tone film 11b is the same as the second mask pattern 12, which will be described below.

The second mask pattern 12 is a semi-transmissive pattern. As shown in FIG. 1A, the second mask pattern 12 has a structure in which multiple line patterns (hereinafter to be referred to as line patterns 12s), each of which being Wm in length and WL2 in width, are arranged periodically at predetermined intervals PL2. In other words, in this embodiment, the second mask pattern is formed in a line-and-space pattern as with the first mask pattern 11, and the size of the second mask pattern 12 can be measured as Wm in width and (width WL2+predetermined interval PL2)×(number of line patterns 12s) in length. As shown in FIG. 1B, the sectional structure of each individual line pattern 12s has a half-tone film formed on the mask substrate 10. The line pattern 12s may be made to a thickness such that it will have a predetermined transmissivity (e.g. approximately 6%) of light.

The second mask pattern 12 is formed at a position apart from the first mask pattern 11 in the same pattern group (i.e., the pattern group A or B shown in FIG. 1A) by a predetermined interval Dm. Therefore, a distance Xm between the center lines of the first mask pattern 11 and the second mask pattern 12 will become (Dm+Wm).

Sizes of First Mask Pattern 11 and Second Mask Pattern 12

Now, an explanation will be given on sizes of the first and second mask patterns 11 and 12. In the following, light penetrating through parts other than the line patterns 12s in the second mask pattern 12 of the phase shift mask 1 will be referred to as first light 1, light penetrating through the line patterns 12s in the second mask pattern 12 will be referred to as second light 2, and a phase difference between the first and second light will be referred to as a phase difference $\Delta\lambda$. A shadow printed on the predetermined substrate by the first mask pattern 11 will be referred to as a first optical image, and a shadow printed on the predetermined substrate by the second mask pattern 12 will be referred to as a second optical image. A resist pattern formed on the predetermined substrate by the first optical image will be referred to as a first resist pattern, and a resist pattern formed on the predetermined substrate by the second optical image will be referred to as a second resist pattern. The position of the phase shift mask 1 on the optical axis with respect to the predetermined substrate at the time when the first optical image and the second optical image formed by the second mask pattern 12 having a thickness enabling the phase difference $\Delta\lambda$ to be 180° is most sharp will be referred to as a focus position $F_0$. At this time, the distance between the predetermined substrate and the phase shift mask 1 will be referred to as a focus distance. The position of the phase shift mask 1 on the optical axis with respect to the predetermined substrate at the time of exposure will be referred to as an exposure mask position Fm. The difference between the distance between the predetermined substrate and the phase shift mask 1 at the time of exposure and the focus distance will be referred to as a defocus distance Fd. The defocus distance Fd can be determined by finding the distance between the focus position $F_0$ and the exposure mask position Fm of the phase shift mask 1 with reference to the predetermined substrate, for instance. With respect to the first and second mask patterns 11 and 12, which are line-and-space patterns, the ratio of the width WL1 or WL2 of the line pattern 11s or 12s to the length of one cycle (WL1+PL1) or (WL2+PL2), i.e., WL1/(WL1+PL1) or WL2/(WL2+PL2), will be referred to as a duty ratio W/P. In the present invention, the optical axis is a type of optical axis which extends between the light source of an exposure unit for exposing the predetermined substrate and the predetermined substrate.

The width Wm and duty ratio W/P of the first and second mask patterns 11 and 12 (q.v. FIG. 1A) are set to certain values which are appropriate enough to have the first and second resist patterns formed on the predetermined substrate through exposure not go through separate resolution or pattern separation. In this description of the embodiment, such condition of the mask patterns will be considered as a first condition.

In addition, in this embodiment, the values of the width and duty ratio W/P of the first and second mask patterns 11 and 12 are set such that a change (hereinafter to be referred to as dWr1) in width of the first resist pattern formed on the predetermined substrate by the first optical image (i.e., a width which corresponds to a length of the line pattern 12s in a longitudinal direction, hereinafter to be referred to as Wr1) and a change (hereinafter to be referred to as dWr2) in width of the second resist pattern formed on the predetermined substrate by the second optical image (hereinafter this width will be referred to as Wr2) will become equal with respect to a change dFm in the exposure mask position Fm at the time when the phase difference $\Delta\lambda$ is 180°. In other words, the width and duty ratio W/P of the first and second mask patterns 11 and 12 are set such that the relation dWr1/dFm=dWr2/dFm will be satisfied. This will simplify the relationship between the width Wr of the first and second resist patterns and the phase difference $\Delta\lambda$, which will be explained in greater detail below. In this description of the embodiment, such condition of the mask patterns will be considered as a second condition.

The values of the width Wm and duty ratio W/P of the first and second mask patterns 11 and 12 satisfying both the first and second conditions as described above can be obtained by applying a known optical simulation etc. prior to manufacturing the phase shift mask 1. Accordingly, a detailed explanation of this relationship will be omitted here.

In addition, the width WL1/WL2 of each line pattern 11s/12s in the first/second mask pattern 11/12 (q.v. FIG. 1A) is set to a value which is appropriate enough to form an outline of a corresponding pattern in the first/second resist pattern 21/22 formed on the predetermined substrate that is sufficiently separated from the other adjacent patterns in the first/second resist patterns 21/22. The interval Dm between the first mask pattern 11 and the second mask pattern 12 in the same pattern group (q.v. FIG. 1A), and the interval Dp between the pattern group A and pattern group B (q.v. FIG. 1A), are set such that the outlines of the first and second resist patterns 21 and 22 formed on the predetermined substrate will not overlap. Here, in all pattern groups, the distance Dm between the first mask pattern 11 and the second mask pattern 12 is supposed to be the same. The values of the width WL1/WL2 and the intervals Dm and Dp satisfying these conditions can also be obtained by applying a known optical simulation etc. prior to manufacturing the phase shift mask 1. Accordingly, a detailed explanation of this relationship will be omitted here. Here, considering the accuracy of an existing optical superimposing measuring instrument, the width Wm should preferably be equal to or greater than 2 µm, and the interval Dm should preferably be equal to or more than 10 µm.

In FIG. 1A, the first mask pattern 11 and the second mask pattern 12 within the same pattern group A/B are separated from each other by the predetermined interval Dm in their width direction. However, this is not a limiting condition in the present invention, and various other arrangements may be possible options as long as the width direction of the first and second mask patterns 11 and 12 are the same. For instance, it is also possible to arrange the second mask pattern 12 in a direction perpendicular to the width direction of the first mask pattern 11 (i.e., in a longitudinal direction of the first mask pattern 11) while having the predetermined interval Dm between the first mask pattern 11. Likewise, in FIG. 1A, the pattern group A and the pattern group B are separated from each other by the predetermined interval Dp in the width direction of the first and second mask patterns 11 and 12. However, this is not a limiting condition in the present invention, and various other arrangements may be possible options as long as the width direction of the first and second mask patterns 11 and 12 are the same. For instance, it is possible to arrange the pattern group B in a direction perpendicular to the width direction of the pattern group A while having the predetermined distance Dp between the pattern group A.

Relationship between Exposure Mask Position Fm and Width Wr of First/Second Resist Pattern Now, the relationship between the exposure mask position Fm and the width Wr1/Wr2 of the first resist pattern/the second resist pattern will be described in detail with reference to the drawings. In the following description, a thickness of the second mask pattern 12 at the time when the phase difference $\Delta\lambda$ becomes 180° will be considered as $D_{180}$, a thickness of the second mask pattern 12 at the time when the phase difference $\Delta\lambda$ becomes 175° will be considered as $D_{175}$, and a thickness of the second mask pattern 12 at the time when the phase difference $\Delta\lambda$ becomes 185° will be considered as $D_{185}$. In addition, the second light penetrating through the line patterns 12s with the thickness $D_{180}$ will be considered as $\lambda_{180}$, the second light penetrating through the line patterns 12s with the thickness $D_{175}$ will be considered as $\lambda_{180}$, and the second light penetrating through the line patterns 12s with the thickness $D_{185}$ will be considered as $\lambda_{185}$. Moreover, the first optical image formed on the predetermined substrate by the first mask pattern 11 will be considered as a first optical image (Cr), the second optical image formed on the predetermined substrate by the second mask pattern 12 having the line patterns 12s with the thickness $D_{180}$ will be considered as a second optical image (180°), the second optical image formed on the predetermined substrate by the second mask pattern 12 having the line patterns 12s with the thickness $D_{175}$ will be considered as a second optical image (175°), and the second optical image formed on the predetermined substrate by the second mask pattern 12 having the line patterns 12s with the thickness $D_{185}$ will be considered as a second optical image (185°). Furthermore, the first resist pattern formed on the predetermined substrate by the first optical image (Cr) will be considered as a first resist pattern 21, the second resist pattern formed on the predetermined substrate by the second optical image (180°) will be considered as a second resist pattern $22_{180}$, the second resist pattern formed on the predetermined substrate by the second optical image (175°) will be considered as a second resist pattern $22_{175}$, and the second resist pattern formed on the predetermined substrate by the second optical image (185°) will be considered as a second resist pattern $22_{185}$.

Figure 2:
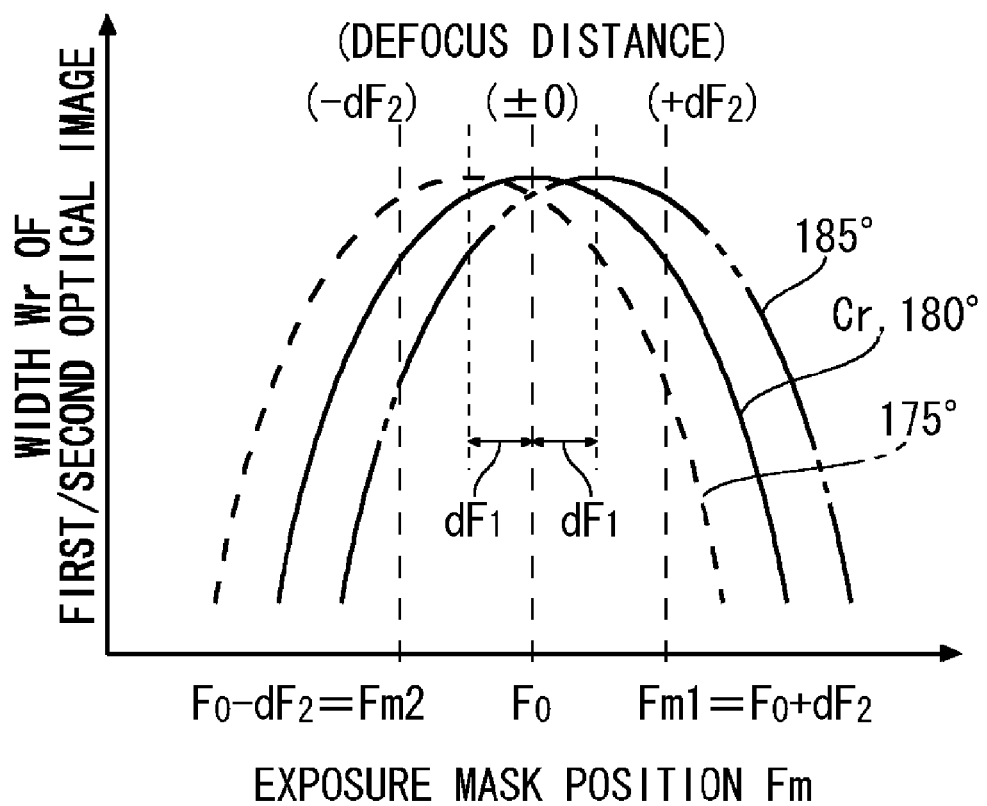
FIG. 2 is a graph of the relationship between a exposure mask position Fm and a width Wr1/Wr2 according to the first embodiment of the present invention.

With reference to FIG. 2, the relationship between the exposure mask position Fm and the width Wr1/Wr2 with respect to four types of resist patterns including the first resist pattern 21, the second resist pattern $22_{180}$, the second resist pattern $22_{175}$ and the second resist pattern $22_{185}$, under the same exposure energy conditions, will be described.

As shown in FIG. 2, in the relation curve of the exposure mask position Fm and the width Wr1 of the first resist pattern 21, the defocus distance Fd becomes ±0, i.e., in this relation curve the width Wr1 becomes widest when the phase shift mask 1 is positioned at the focus position $F_0$ while it becomes smaller as the exposure mask position Fm deviates from the focus position $F_0$. Likewise, in the relation curve of the exposure mask position Fm and the width Wr2 of the second resist pattern $22_{180}$ (hereinafter this width Wr2 will be referred to as $Wr2_{180}$), the defocus distance Fd becomes ±0, i.e., in this relation curve the width $Wr2_{180}$ becomes widest when the phase shift mask 1 is positioned at the focus position $F_0$ while it becomes smaller as the exposure mask position Fm deviates from the focus position $F_0$. This means that the first optical image (Cr) and the second optical image (180°) which are formed at the time when the exposure mask position Fm is at the focus position $F_0$ will become most focused, and will become more defocused as the exposure mask position Fm deviates from the focus position $F_0$. As the outlines of the first optical image (Cr) and the second optical image (180°) become defocused, the image intensities of these optical images will deteriorate, and the width Wr1 and $Wr2_{180}$ of the first resist pattern 21 and the second resist pattern $22_{180}$ to be printed on the predetermined substrate by these optical images will become small. In this embodiment, the width Wr1 and Wr2 of the first and the second resist patterns are considered as the widths of upper surface regions of the resist patterns, respectively, for instance. In addition, in this embodiment, the image intensity indicates how sharp the outlines of the first and second optical images are, i.e. how close to vertical the sides of the first and the second resist patterns are.

As can be seen in FIG. 2, as the exposure mask position Fm deviates further away from the focus position $F_0$, i.e., as the absolute value of the defocus distance Fd becomes larger, the slopes of the relation curves with respect to the width Wr1 of the first resist pattern 21 and the exposure mask position Fm, and the width $Wr2_{180}$ of the second resist pattern $22_{180}$ and the exposure mask position Fm, respectively, will become steeper. In other words, the change dWr1 of the width Wr1 of the first resist pattern 21 and the change $Wr2_{180}$ of the width $Wr2_{180}$ of the second resist pattern $22_{180}$ will become larger as the exposure mask position Fm deviates further away from the focus position $F_0$.

On the other hand, as can be seen in FIG. 2, the relation curve of the width Wr2 of the second resist pattern $22_{175}$ (hereinafter this width Wr2 will be referred to as a width $Wr2_{175}$) and the exposure mask position Fm is equivalent to the relation curve of the width $Wr2_{180}$ of the second resist pattern $22_{180}$ and the exposure mask position Fm shifted in the negative direction by a predetermined distance (i.e., dF1 in FIG. 2). This means that the second optical image (175°) will become most focused when the exposure mask position Fm deviates from the focus position $F_0$ toward the predetermined substrate by a wavelength equivalent to a difference between the phase difference $\Delta\lambda$ of the second light $\lambda_{175}$ with respect to the first light and the phase difference $\Delta\lambda$ of the second light $\lambda_{180}$ with respect to the first light (in this description of the embodiment, this wavelength will be considered as dF1), and the image intensity will deteriorate as the exposure mask position Fm deviates further than that. Likewise, the relation curve of the width Wr2 of the second resist pattern $22_{185}$ (hereinafter this width Wr2 will be referred to as a width $Wr2_{185}$) and the exposure mask position Fm is equivalent to the relation curve of the width $Wr2_{180}$ of the second resist pattern $22_{180}$ and the exposure mask position Fm shifted in the positive direction by a predetermined distance (i.e., dF1 in FIG. 2). This means that the second optical image (185°) will become most focused when the exposure mask position Fm deviates from the focus position $F_0$ in a receding direction from the predetermined substrate by a wavelength equivalent to the difference between the phase difference $\Delta\lambda$ of the second light $\lambda_{185}$ with respect to the first light and the phase difference $\Delta\lambda$ of the second light $\lambda_{180}$ with respect to the first light (in this description of the embodiment, this wavelength will also be considered as dF1), and the image intensity will deteriorate as the exposure mask position Fm deviates further than that.

Considering the above points, in this embodiment, the exposure mask position Fm is shifted from the focus position $F_0$ by a predetermined distance (in this description of the embodiment, this predetermined distance will be considered as dF2) when exposing a resist solution on the predetermined substrate 20 in order to be able to use a region of each relation curve where its slope is very steep. In other words, the exposure mask position Fm is determined such that the region of the relation curve where the change dWr2 of the width Wr2 of the second resist pattern 22 with respect to the change in thickness of the second mask pattern 12 is large can be used. Here, the predetermined distance dF2 should preferably be a value which is sufficiently larger than a wavelength equivalent to a predictable maximum shift from the phase difference $\Delta\lambda$ (hereinafter this shift will be considered as $d\lambda$max), which is 180°. By this arrangement, it is possible to make the change dWr1 of the width Wr1 of the first resist pattern 21 and the change dWr2 of the width Wr2 of the second resist pattern 22 with respect to the change in thickness of the second mask pattern 12 to be in the same direction. However, when the distance dF2 is too large, the first optical image and the second optical image will become blurry, which may cause the first and the second resist patterns 21 and 22 to not to be formed. Therefore, the predetermined distance dF2 should be set to a value within a range enabling the outlines of the first and second resist patterns 21 and 22 formed by the first and the second optical images to be sufficiently recognizable. In this embodiment, an example will be given of a situation in which the exposure mask position Fm is set as Fm1 (=$F_0$+dF2). However, it is also possible to set the exposure mask position Fm to a position Fm2 (=$F_0$−dF2), which is toward the predetermined substrate with respect to the focus position $F_0$.

Figure 3:
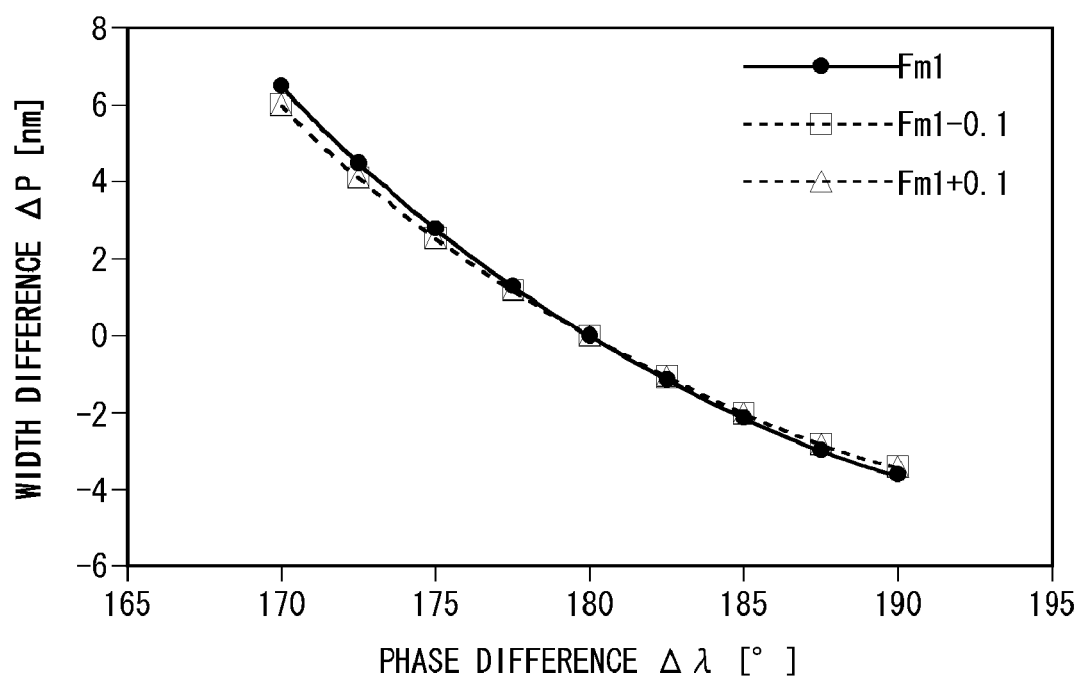
FIG. 3 is a graph of the relationship between a width difference $\Delta P$ and a phase difference $\Delta\lambda$ X according to the first embodiment of the present invention.

The relationship between the width difference $\Delta P$ and the phase difference $\Delta\lambda$ when the predetermined distance dF2 is set to a value which is sufficiently larger than the wavelength equivalent to the predictable maximum difference $d\lambda$max can be represented by a correspondence line shown in FIG. 3. The following explanation referring to FIG. 3 will be based on the width $Wr2_{180}$ of the second resist pattern $22_{180}$ taken as a reference, and a half value of a difference between the reference width $Wr2_{180}$ and the width Wr2 of the second resist pattern 22 which is actually formed (this value corresponds with the width difference $\Delta P=(Wr2-Wr2180)/2$ which will be mentioned later on).

When the defocus distance Fd of the exposure mask position Fm1 is set to a value dF2 that is sufficiently larger than the wavelength equivalent to the predictable maximum difference $d\lambda$max, the phase difference $\Delta\lambda$ will correspond one-to-one with the width difference $\Delta P$, and the correspondence line will become an approximate straight line, as shown in FIG. 3. Therefore, by identifying the width difference $\Delta P$, it is possible to easily specify the phase difference $\Delta\lambda$. The correspondence line of the width difference $\Delta P$ and the phase difference $\Delta\lambda$ can be obtained in advance through appropriate experimentation or simulation. In this embodiment, it is preferable that the exposure mask position Fm1 is set to a position where the correspondence line shown in FIG. 3 becomes the steepest, within a range fulfilling the above-described first and second conditions.

FIG. 3 also shows a correspondence line when the position of the predetermined substrate 20 with respect to the phase shift mask 1 at the time of exposure is shifted from the focus position $F_0$ by ±0.1 μm, i.e., a situation in which the distance between the predetermined substrate and the phase shift mask 1 at the time of exposure is shifted from the focus distance by the defocus distance dF=±0.1 μm. As can be seen in FIG. 3, even when the distance between the predetermined substrate and the phase shift mask 1 at the time of exposure is shifted from the focus distance by the defocus distance dF=±0.1 μm, the correspondence line will hardly change. Accordingly, in this embodiment, when measuring the phase differences $\Delta\lambda$ with respect to multiple positions in the phase shift mask 1, for instance, even under conditions in which the distance between the predetermined substrate 20 and the phase shift mask 1 at the time of exposure becomes slightly shifted from the focus distance due to a difference or distortion in the predetermined substrate 20 equal to approximately ±0.1 μm, it is possible to measure the phase difference $\Delta\lambda$ with little or no reduction in measuring precision.

Structures of First and Second Resist Patterns

Now, structures of the first and second resist patterns formed on the predetermined substrate using the phase shift mask 1 according to the first embodiment will be described with reference to the drawings.

Phase Shift Difference $\Delta\lambda$ is 180°

Figure 4A:
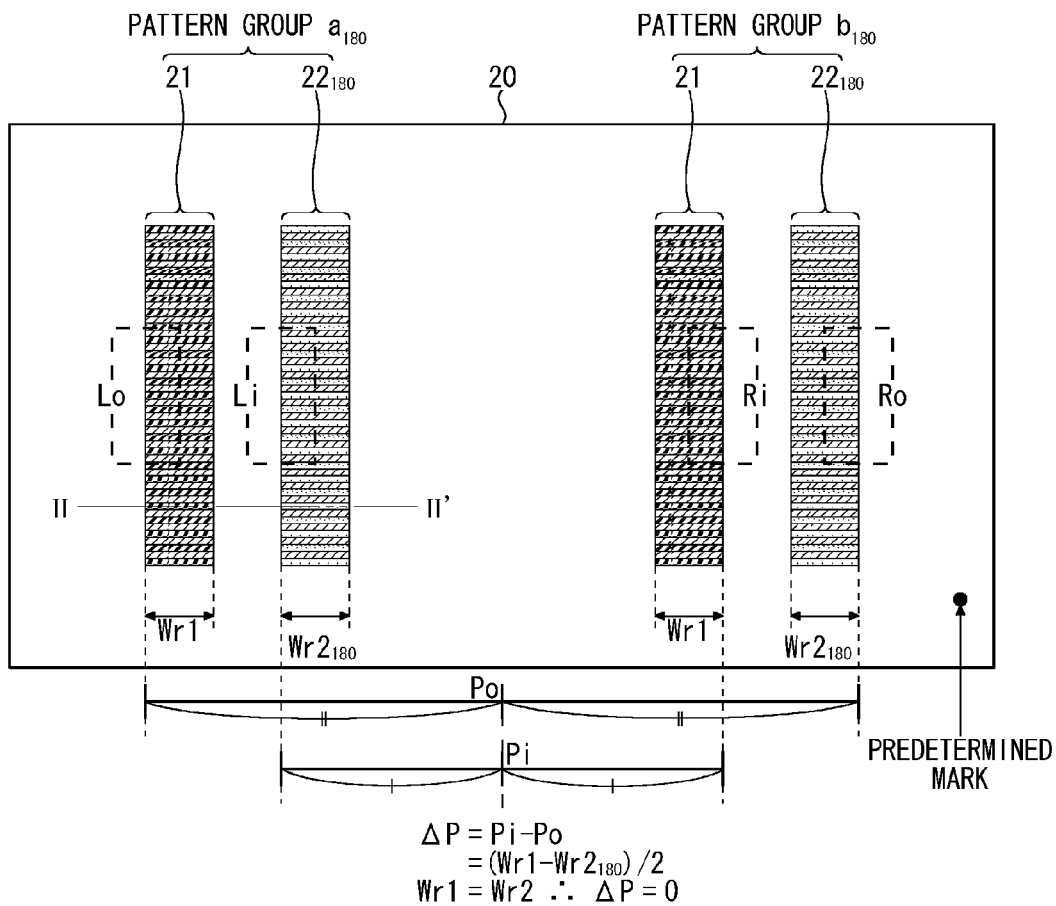
FIG. 4A is a plan view showing the structures of first and second resist patterns 21 and $22_{180}$ according to the first embodiment of the present invention.
Figure 4B:
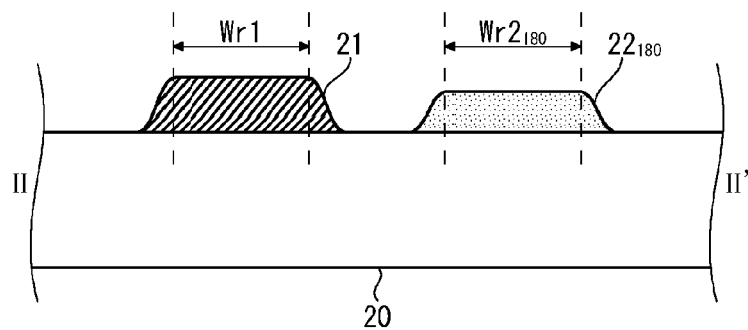
FIG. 4B is a sectional view showing the structures of the first and second resist patterns 21 and $22_{180}$ taken along a line II–II' shown in FIG. 4A.

FIG. 4A is a plan view showing the structures of the first and second resist patterns 21 and $22_{180}$ formed on the predetermined substrate 20 when the phase shift mask 1 is positioned at the exposure mask position Fm1. FIG. 4B is a sectional view showing the structures of the first and second resist patterns 21 and $22_{180}$ taken along a line II–II' shown in FIG. 4A. At the time of exposure, the predetermined substrate 20 is supposed to have a positive type photo-resist being applied thereon. In this case, however, it is also possible to apply a negative type photo-resist on the predetermined substrate 20.

In FIG. 4A, a pattern group $a_{180}$ is being formed by having the pattern group A in FIG. 1A projected onto the predetermined substrate 20. Likewise, a pattern group $b_{180}$ is being formed by having the pattern group B in FIG. 1A projected onto the predetermined substrate 20. The first resist pattern 21 in FIG. 4A is formed by the first mask pattern 11 in FIG. 1A and the second resist pattern $22_{180}$ in FIG. 4A is formed by the second mask pattern 12 in FIG. 1A.

Here, as described above, the width Wm and the duty ratio W/P of the first and second mask patterns 11 and 12 are set to such values that enables the first and second resist patterns 21 and $22_{180}$ to have rectangular shapes and to have linear shaped edges, and fulfills the relationship dWr1/dF=dWr2/dF. Accordingly, the relation curves with respect to the width Wr1 of the first resist pattern 11 and the width $Wr2_{180}$ of the second resist pattern $22_{180}$ will both become the curve indicated by 'Cr, 180°' in FIG. 2. Therefore, when the exposure mask position Fm is Fm1, the width Wr1 of the first resist pattern 11 and the width $Wr2_{180}$ of the second resist pattern $22_{180}$ will become equal to each other. Furthermore, the sides of the first and second resist patterns 21 and $22_{180}$ will form steep slopes as shown in FIG. 4B.

Phase Shift Difference $\Delta\lambda$ is 175°

Figure 5A:
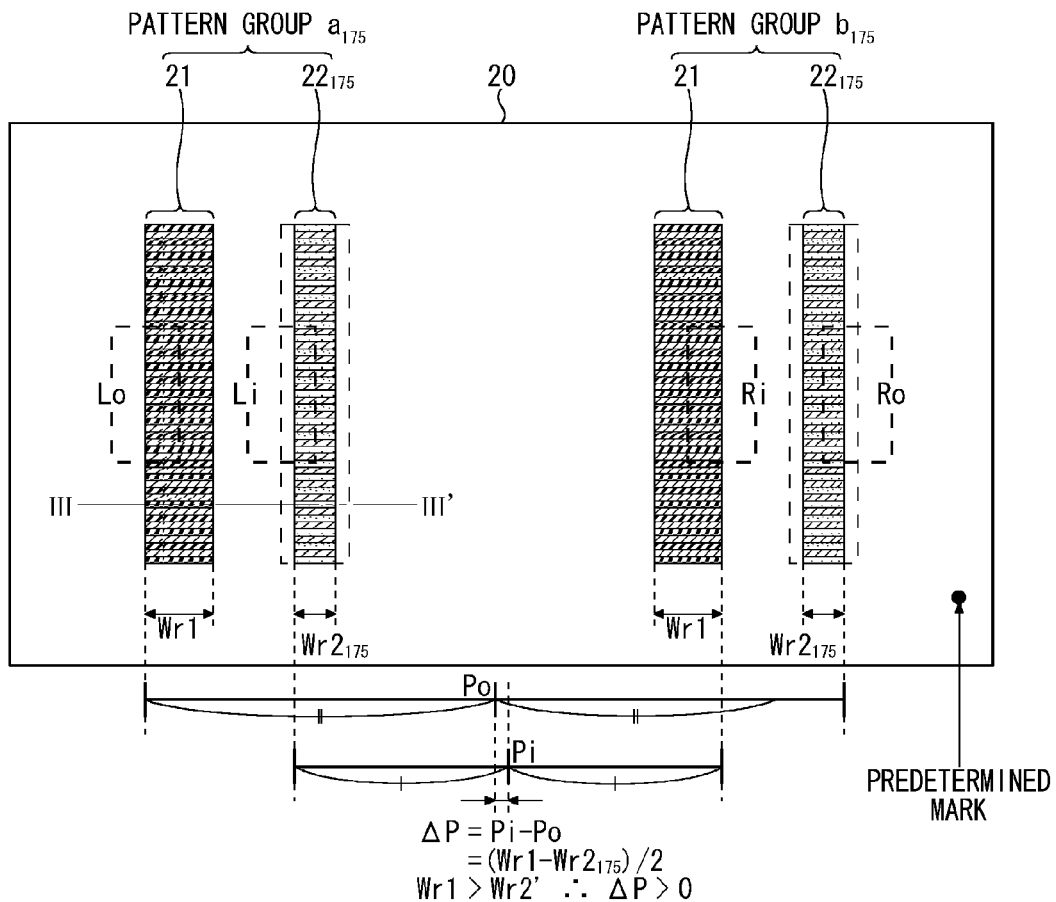
FIG. 5A is a plan view showing the structures of first and second resist patterns 21 and $22_{175}$ according to the first embodiment of the present invention.
Figure 5B:
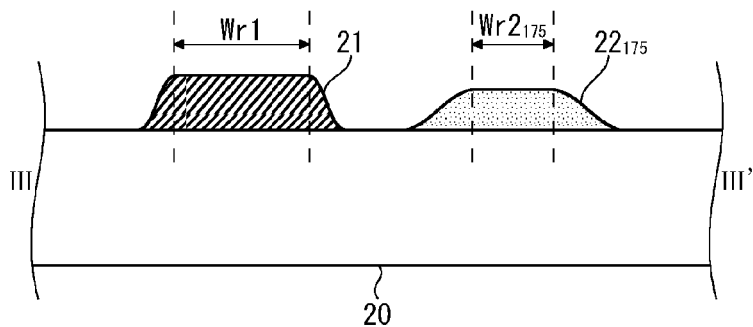
FIG. 5B is a sectional view showing the structures of the first and second resist patterns 21 and $22_{175}$ taken along a line III–III' shown in FIG. 5A.

Now, structures of the first and second resist patterns 21 and $22_{175}$ formed on the predetermined substrate 20 when the phase shift mask 1 is positioned at the exposure mask position Fm1 will be described in detail with reference to the drawings. FIG. 5A is a plan view showing the structures of the first and second resist patterns 21 and $22_{175}$, and FIG. 5B is a sectional view showing the structures of the first and second resist patterns 21 and $22_{175}$ taken along a line III–III' shown in FIG. 5A. As in the case described with reference to FIG. 4A and FIG. 4B, at the time of exposure, the predetermined substrate 20 is supposed to have a positive type photo-resist being applied thereon.

In FIG. 5A, a pattern group $a_{175}$ is being formed by having the pattern group A in FIG. 1A projected onto the predetermined substrate 20. Likewise, a pattern group $b_{175}$ is being formed by having the pattern group B in FIG. 1A projected onto the predetermined substrate 20. The first resist pattern 21 in FIG. 5A is formed by the first mask pattern 11 in FIG. 1A and the second resist pattern $22_{175}$ in FIG. 5A is formed by the second mask pattern 12 in FIG. 1A.

Here, as describe above, the width Wm and the duty ratio W/P of the first and second mask patterns 11 and 12 are set to values that enable the first and second resist patterns 21 and $22_{175}$ to have rectangular shapes and to have linear shaped edges, and fulfills the relationship dWr1/dF=dWr2/dF when a thickness of the second mask pattern 12 is $D_{180}$. Accordingly, the relation curve with respect to the width Wr1 of the first resist pattern 11 will become the curve indicated by 'Cr' in FIG. 2, whereas the relation curve with respect to the width $Wr2_{175}$ of the second resist pattern $22_{175}$ will become the curve indicated by '175°' in FIG. 2, which is equivalent to the relation curve with respect to the width Wr1 of the first resist pattern 21 shifted to the left. Therefore, when the exposure mask position Fm is Fm1, the width $Wr2_{175}$ of the second resist pattern $22_{175}$ will become smaller than the width Wr1 of the first resist pattern 21 by an amount obtained from the relation curve (175°) corresponding to a shift in the thickness of the second mask pattern 12 from the thickness $D_{180}$. Thereby, as shown in FIG. 5B, the sides of the second resist pattern $22_{175}$ will form slopes which are less steep than the slopes of the sides of the first resist pattern 21, and as shown in FIG. 5A, the width $Wr2_{175}$ of the second resist pattern $22_{175}$ will become smaller than the width Wr1 of the first resist pattern 21.

Phase Shift Difference Δλ is 185°

Figure 6A:
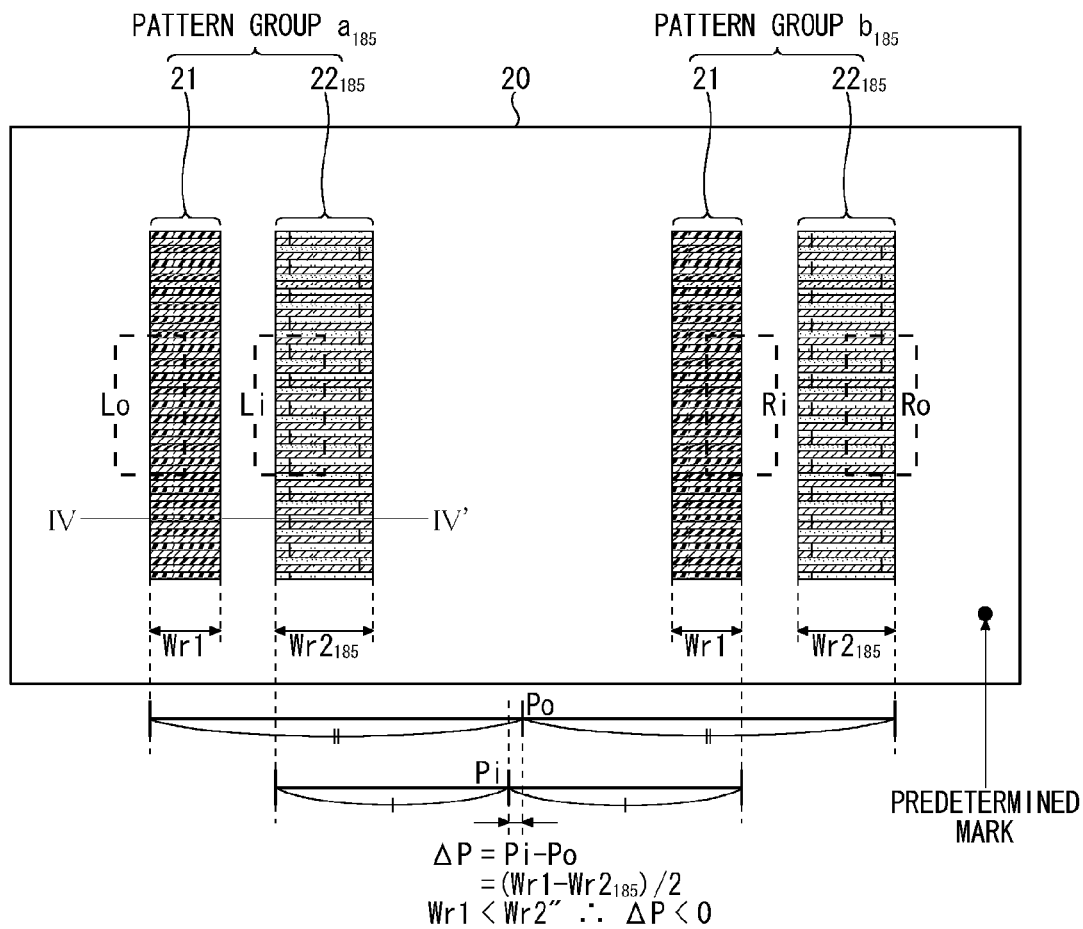
FIG. 6A is a plan view showing the structures of first and second resist patterns 21 and $22_{185}$ according to the first embodiment of the present invention.
Figure 6B:
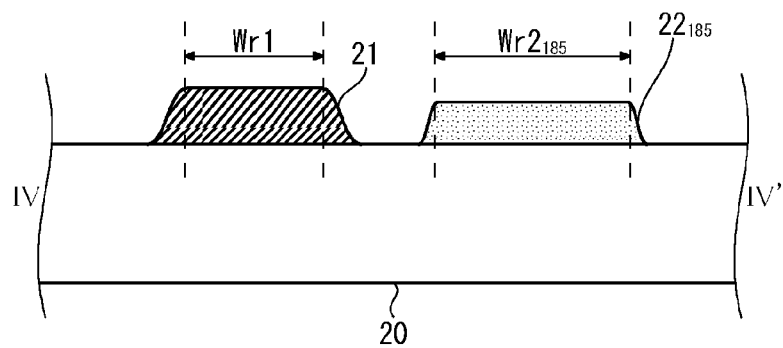
FIG. 6B is a sectional view showing the structures of the first and second resist patterns 21 and $22_{185}$ taken along a line IV–IV' shown in FIG. 6A.

Now, structures of the first and second resist patterns 21 and $22_{185}$ formed on the predetermined substrate 20 when the phase shift mask 1 is positioned at the exposure mask position Fm1 will be described in detail with reference to the drawings. FIG. 6A is a plan view showing the structures of the first and second resist patterns 21 and $22_{185}$, and FIG. 6B is a sectional view showing the structures of the first and second resist patterns 21 and $22_{185}$ taken along a line IV–IV' shown in FIG. 6A. As in the case described with reference to FIG. 4A and FIG. 4B, at the time of exposure, the predetermined substrate 20 is supposed to have a positive type photo-resist being applied thereon.

In FIG. 6A, a pattern group $a_{185}$ is being formed by having the pattern group A in FIG. 1A projected onto the predetermined substrate 20. Likewise, a pattern group $b_{185}$ is being formed by having the pattern group B in FIG. 1A projected onto the predetermined substrate 20. The first resist pattern 21 in FIG. 6A is formed by the first mask pattern 11 in FIG. 1A and the second resist pattern $22_{185}$ in FIG. 6A is formed by the second mask pattern 12 in FIG. 1A.

Here, as described above, the width Wm and the duty ratio W/P of the first and second mask patterns 11 and 12 are set to values that enable the first and second resist patterns 21 and $22_{185}$ to have rectangular shapes and to have linear shaped edges, and fulfills the relationship dWr1/dF=dWr2/dF when a thickness of the second mask pattern 12 is $D_{180}$. Accordingly, the relation curve with respect to the width Wr1 of the first resist pattern 11 will become the curve indicated by 'Cr' in FIG. 2, whereas the relation curve with respect to the width $Wr2_{185}$ of the second resist pattern $22_{185}$ will become the curve indicated by '185°' in FIG. 2, which is equivalent to the relation curve with respect to the width Wr1 of the first resist pattern 21 shifted to the right. Therefore, when the exposure mask position Fm is Fm1, the width $Wr2_{185}$ of the second resist pattern $22_{185}$ will become smaller than the width Wr1 of the first resist pattern 21 by an amount obtained from the relation curve (185°) corresponding to a shift in the thickness of the second mask pattern 12 from the thickness $D_{180}$. Thereby, as shown in FIG. 6B, the sides of the second resist pattern $22_{185}$ will form slopes which are steeper than the slopes of the sides of the first resist pattern 21, and as shown in FIG. 6A, the width $Wr2_{185}$ of the second resist pattern $22_{185}$ will become wider than the width Wr1 of the first resist pattern 21.

Phase Difference Specifying Method

Now, a method of specifying the phase difference Δλ based on the first resist pattern 21 and the second resist pattern $22_{180}$, $22_{175}$ or $22_{185}$ will be described.

In specifying the phase difference Δλ, first, images of the outlines of the first resist pattern 21 and the second resist pattern 21, $22_{180}$, $22_{175}$ or $22_{185}$ are taken by an imaging device such as an optical superimposing measuring instrument, for instance. In the following explanation, the second resist patterns $22_{180}$, $22_{175}$ and $22_{185}$ will be referred to simply as the second resist pattern 22 where appropriate. In addition, the pattern group $a_{180}$, $a_{175}$ and $a_{185}$ will be referred to simply as the pattern group a where appropriate. Likewise, the pattern group $b_{180}$, $b_{175}$ and $b_{185}$ will be referred to simply as the pattern group b where appropriate.

At the time that images of the outlines of the first and the second resist patterns 21 and 22 are taken, certain relative positions with reference to a predetermined mark provided within the structure of the predetermined substrate 20 shown in FIG. 4A, FIG. 5A or FIG. 6A are specified with respect to imaging regions Lo, Li, Ri and Ro, respectively. Here, when the pattern group a is disposed at the left side of the pattern group b, the imaging region Lo will include a portion of the outline in the left side of the first resist pattern 21 in the pattern group a, and the imaging region Li will include a portion of the outline in the left side of the second resist pattern 22 in the pattern group a. Likewise, the imaging region Ro will include a portion of the outline in the right side of the second resist pattern 22 in the pattern group b, and the imaging region Ri will include a portion of the outline in the right side of the first resist pattern 21 in the pattern group b.

Next, the portion of the outline in the left side of the first resist pattern 21 in the pattern group a is identified based on the image of the imaging region Lo through an image recognition process, for instance, and the position of this identified outline portion in a horizontal direction with respect to the predetermined mark (hereinafter to be referred to as a first outline position) will be specified. In the meantime, the portion of outline in the right side of the second resist pattern 22 in the pattern group b is identified based on the image of the imaging region Ro, and the position of this identified outline portion in a horizontal direction with respect to the predetermined mark (hereinafter to be referred to as a second outline position) will be specified. Then, based on the specified first and second outline positions, the midpoint position between these two will be specified (hereinafter to be referred to as a first midpoint position Po). In this description, 'the horizontal direction' is the direction in which the pattern groups a and b are arranged (i.e., the horizontal direction in the drawings).

Next, the portion of the outline in the left side of the second resist pattern 22 in the pattern group a is identified based on the image of the imaging region Li through an image recognition process, for instance, and the position of this identified outline portion in the horizontal direction with respect to the predetermined mark (hereinafter to be referred to as a third outline position) will be specified. In the meantime, the portion of outline in the right side of the first resist pattern 21 in the pattern group b is identified based on the image of the imaging region Ri, and the position of this identified outline portion in a horizontal direction with respect to the predetermined mark (hereinafter to be referred to as a fourth outline position) will be specified. Then, based on the specified third and fourth outline positions, the midpoint position between these two will be specified (hereinafter to be referred to as a second midpoint position Pi). In this description, 'the horizontal direction' is the direction in which the pattern groups a and b are arranged (i.e., the horizontal direction in the drawings).

After the first midpoint position Po and the second midpoint position Pi are determined in this way, the width difference $\Delta P$ (=Pi−Po) between the two midpoint positions is to be calculated.

Here, if the thickness of the second mask pattern 12 is $D_{180}$, the width Wr1 of the first resist pattern 21 and the width Wr2 of the second resist pattern 22 are supposed to be the same (q.v. FIG. 4A). Accordingly, the width difference $\Delta P$ (=Pi−Po) between the first midpoint position Po and the second midpoint position Pi in a horizontal direction will become '0'.

However, when the thickness of the second mask pattern 12 is set to a value by which the phase difference becomes 175°, for instance, the width $Wr2_{175}$ of the second resist pattern $22_{175}$ will become smaller than the width Wr1 of the first resist pattern 21 as shown in FIG. 5A. Therefore, the first midpoint position Po determined in the above-described way will be shifted in a leftward direction by half of the value obtained by subtracting half the width $Wr2_{175}$ from half the width $Wr2_{180}$ (=Wr1), i.e., by $(Wr1-Wr2_{175})/4$, as compared to when the phase shift mask 1 having the second mask pattern 12 with the thickness $D_{180}$ is used. On the other hand, the second midpoint position Pi will be shifted in a rightward direction by half of the value obtained by subtracting half the width $Wr2_{175}$ from half the width $Wr2_{180}$ (=Wr1), i.e., by $(Wr1-Wr2_{175})/4$, as compared to when the phase shift mask 1 having the second mask pattern 12 with the thickness $D_{180}$ is used. Accordingly, the width difference $\Delta P$ (=Pi−Po) between the first midpoint position Po and the second midpoint position Pi in a horizontal direction will become $(Wr1-Wr2_{175})/2$ (>0).

Moreover, when the thickness of the second mask pattern 12 is set to a value by which the phase difference becomes 185°, the width $Wr2_{185}$ of the second resist pattern $22_{185}$ will become smaller than the width Wr1 of the first resist pattern 21 as shown in FIG. 6A. Therefore, the first midpoint position Po determined in the above-described way will be shifted in a rightward direction by half of the value obtained by subtracting half the width $Wr2_{185}$ from half the width $Wr2_{180}$ (=Wr1), i.e., by $(Wr1-Wr2_{185})/4$, as compared to when the phase shift mask 1 having the second mask pattern 12 with the thickness $D_{180}$ is used. On the other hand, the second midpoint position Pi will be shifted in a leftward direction by half of the value obtained by subtracting half the width $Wr2_{185}$ from half the width $Wr2_{180}$ (=Wr1), i.e., by $(Wr1-Wr2_{185})/4$, as compared to when the phase shift mask 1 having the second mask pattern 12 with the thickness $D_{180}$ is used. Accordingly, the width difference $\Delta P$ (=Pi−Po) between the first midpoint position Po and the second midpoint position Pi in a horizontal direction will become $-(Wr1-Wr2_{185})/2$ (<0).

In this way, after the width difference $\Delta P$ is specified, the phase difference $\Delta \lambda$ is to be specified based on a correspondence relation (q.v. FIG. 3) between the width difference $\Delta P$ and the phase difference $\Delta \lambda$ which was obtained previously.

Method of Manufacturing Phase Shift Mask 1

Now, a method of manufacturing the phase shift mask 1 according to this embodiment will be described in detail with reference to FIGS. 7A to 7E. FIGS. 7A to 7E are diagrams showing processes of manufacturing the phase shift mask 1. In each of FIGS. 7A to 7E, a section corresponding to the I–I' section in FIG. 1A under each process is illustrated.

Figure 7A:
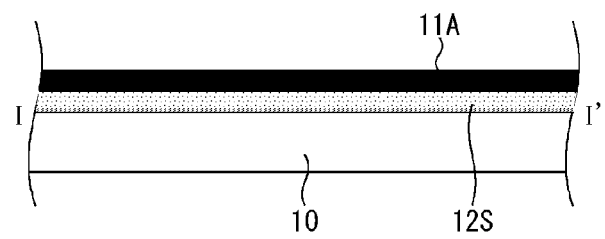
FIGS. 7A to 7E are diagrams showing processes of manufacturing the phase shift mask according to the first embodiment of the present invention.

In this manufacturing method, first, a mask substrate 10 made of glass (e.g. synthetic quartz etc.) with a thickness of 6.35 mm is prepared. Then, as shown in FIG. 7A, chrome oxide ($CrO_2$) and chrome (Cr) are deposited sequentially to form a chrome oxide ($CrO_2$) film 12S and a chrome (Cr) film 11A sequentially on the mask substrate 10. In forming the chrome oxide ($CrO_2$) film 12S and the chrome (Cr) film 11A, it is possible to use a CVD (chemical vapor deposition) method, for instance. As for the thicknesses of the chrome oxide ($CrO_2$) film 12S and the chrome (Cr) film 11A, both of them can be formed to a thickness of 100 μm, for instance.

Figure 7B:
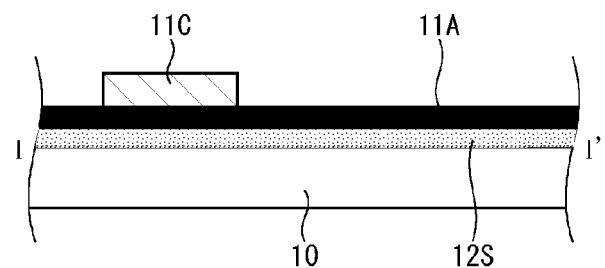

Then, after spin-coating a predetermined resist solution on the chrome (Cr) film 11A, a resist pattern 11C having the same shape as the first mask pattern 11 is formed using existing exposure and development processes, as shown in FIG. 7B.

Figure 7C:
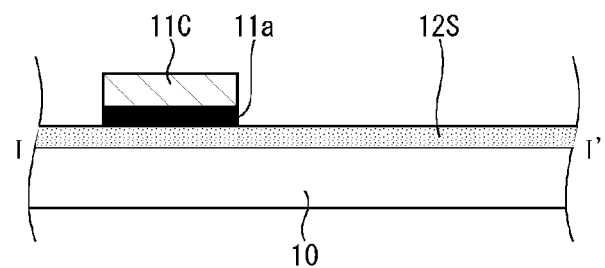

Then, using an existing etching method, for instance, the chrome (Cr) film 11A is etched while the resist pattern 11C is used as a mask. By this arrangement, the chrome (Cr) film 11A is processed into the same shape as the first mask pattern 11 to become a backing film 11a of the first mask pattern 11 as shown in FIG. 7C. After that, the resist pattern 11C will be removed.

Figure 7D:
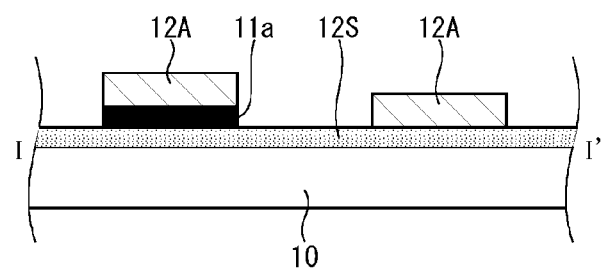

Then, after spin-coating a predetermined resist solution on the backing film 11a and the exposed chrome oxide ($CrO_2$) film 12S, resist patterns 12A having the same shapes as the first and second mask patterns 11 and 12 are formed, using existing exposure and development processes, as shown in FIG. 7D.

Figure 7E:
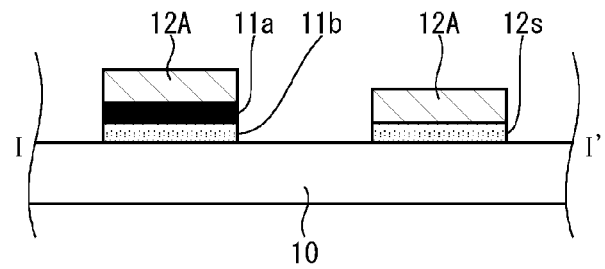

Then, using an existing etching method, for instance, the chrome oxide ($CrO_2$) film 12S is etched, while the resist patterns 12A are used as masks, to be processed into the same shapes as the first and second mask patterns 11 and 12, as shown in FIG. 7E. By such arrangement, the first mask pattern 11 made up of the backing film 11a and a half-tone film 11b, and the second mask pattern 12 made up of a half-tone film 12s can be obtained. Then, by removing the resist patterns 12A, the phase shift mask 1 as shown in FIG. 1A and FIG. 1B can be obtained.

Method of Manufacturing Semiconductor Device

Now, one example of manufacturing a semiconductor device by applying an exposure method using the phase shift mask 1 according to the first embodiment of the present invention will be described with reference to the drawing. FIG. 8 is a flow chart showing processes of manufacturing the semiconductor device which include exposure processes using the phase shift mask 1.

As shown in FIG. 8, first, a semiconductor wafer for having a semiconductor element built therein is prepared (step S101). This semiconductor wafer will be mounted on a wafer adsorption table.

Then, the phase shift mask (1) is disposed at the optimum exposure mask position Fm, which has previously been determined based on the phase difference $\Delta\lambda$ calculated through the above-described phase difference specifying method (step S102).

Next, the semiconductor wafer is spin-coated with a resist solution (step S103), after which it is exposed using the phase shift mask (1) (step S104) and then developed (step S105) to form a desired resist thereon. After that, manufacturing of the semiconductor device will be completed through predetermined processes.

As described above, in accordance with the phase difference specifying method according to this embodiment, the first and second resist patterns (21, 22) can be simply formed on a predetermined substrate (20) using production devices (e.g. exposure apparatus, resist coater, imaging device, etc.) which are used in normal photolithography. Furthermore, the first and the second resist patterns (21, 22) formed on the predetermined substrate (20) can have their shapes specified based on images obtained using a typical imaging device such as an optical superimposing measuring device etc. Moreover, by specifying the positions (e.g. the positions of the outline portions) of the first and the second resist patterns (21, 22) based on the obtained images, it is possible to easily calculate the difference between the width of the first resist pattern (21) and the width of the second resist pattern (22) with high precision. Accordingly, by previously finding the correspondence relationship between the difference in the widths of the first and the second resist patterns (21, 22) (e.g. the width difference $\Delta P$ based thereon) and the phase difference ($\Delta\lambda$) between a first light and a second light, for instance, it is possible to actually specify the phase difference ($\Delta\lambda$) between the first light and the second light easily and accurately. In addition, according to this embodiment, it is possible to specify the phase difference ($\Delta\lambda$) without having to use any exclusive measuring device etc. Other than that, according to this embodiment, when measuring the phase differences ($\Delta\lambda$) with respect to multiple positions in a phase shift mask (1) etc., for instance, even under conditions in which the distance between the predetermined substrate (20) and the phase shift mask (1) at the time of exposure becomes slightly shifted from the focus distance due to a difference or distortion in the predetermined substrate 20 of approximately $\pm 0.1$ μm, it is possible to measure the phase difference ($\Delta\lambda$) with little or no reduction in measuring precision.

In accordance with the method of manufacturing a phase shift mask according to this embodiment, a backing film (11a) is processed into a first shape (e.g. a line-and-space pattern) which enables a first optical image to be formed on a predetermined substrate (20) that is the target of exposure, the first optical image capable of forming a first resist pattern (21) having a width (Wr1) that changes depending on a distance (Fm) from the predetermined substrate (20), and a semi-transmissive film is processed into a second shape (e.g. a line-and-space pattern) which enables a second optical image to be formed on the predetermined substrate (20), the second optical image capable of forming a second resist pattern (22) having a width (Wr2) that changes depending on the distance (Fm) from the predetermined substrate (20) and on the thickness of the semi-transmissive film. The backing film and the semi-transmissive film are formed on a phase shift mask (1). Using this phase shift mask (1) together with productive devices (e.g. exposure apparatus, resist coater, imaging device, etc.) used in normal photolithography, a first resist pattern (21) having a width (Wr1) that changes depending on the distance (Fm) from the predetermined substrate (20), and a second resist pattern (22) having a width (Wr2) that changes depending on the distance (Fm) from the predetermined substrate (20) and on the thickness of the semi-transmissive film, can be easily formed on the predetermined substrate (20). The first and the second resist patterns (21, 22) formed on the predetermined substrate (20) in this way can have their shapes specified based on images obtained using a typical imaging device, such as an optical superimposing measuring device etc. Furthermore, by specifying the positions (e.g. the positions of the outline portions) of the first and the second resist patterns (21, 22) based on the obtained images, it is possible to easily calculate the difference between the width (Wr1) of the first resist pattern (21) and the width (Wr2) of the second resist pattern (22) (e.g. the width difference $\Delta P$ based thereon) with high precision. Accordingly, by previously finding the correspondence relationship between the width difference between the first and the second resist patterns (21, 22) (e.g. the width difference $\Delta P$ based thereon) and the phase difference ($\Delta\lambda$) between a first light and a second light, for instance, it is possible to actually specify the phase difference ($\Delta\lambda$) between the first light and the second light easily and accurately. In addition, by using the phase shift mask (1) manufactured according to this embodiment, it is possible to specify the phase difference ($\Delta\lambda$) without having to use any exclusive measuring device etc. Other than that, by using the phase shift mask (1) manufactured according to this embodiment, when measuring the phase differences ($\Delta\lambda$) with respect to multiple positions in a phase shift mask (1), for instance, even under conditions in which the distance between the predetermined substrate (20) and the phase shift mask (1) at the time of exposure becomes slightly shifted from the focus distance due to a difference or distortion in the predetermined substrate 20, it is possible to measure the phase difference ($\Delta\lambda$) with little or not reduction in measuring precision.

In accordance with the phase shift mask according to this embodiment, a phase shift mask (1) has a backing film (11a) that is processed into a first shape (e.g. a line-and-space pattern) which enables a first optical image to be formed on a predetermined substrate (20) that is the target of exposure, the first optical image capable of forming a first resist pattern (21) having a width (Wr1) that changes depending on the distance (Fm) from the predetermined substrate (20), and a semi-transmissive film processed into a second shape (e.g. a line-and-space pattern) which enables a second optical image to be formed on the predetermined substrate (20), the second optical image capable of forming a second resist pattern (22) having a width (Wr2) that changes depending on the distance (Fm) from the predetermined substrate (20) and on the thickness of the semi-transmissive film, formed thereon. Using such phase shift mask (1) together with productive devices (e.g. exposure apparatus, resist coater, imaging device, etc.) used in normal photolithography, the first resist pattern (21) having the width (Wr1) that changes depending on the distance (Fm) from the predetermined substrate (20), and the second resist pattern (22) having the width (Wr2) that changes depending on the distance (Fm) from the predetermined substrate (20) and on the thickness of the semi-transmissive film, can be easily formed on the predetermined substrate (20). The first and the second resist patterns (21, 22) formed on the predetermined substrate (20) in this way can have their shapes specified based on images obtained using a typical imaging device such as an optical superimposing measuring device etc. Furthermore, by specifying the positions (e.g. the positions of the outline portions) of the first and the second resist patterns (21, 22) based on the obtained images, it is possible to easily calculate the difference between the width (Wr1) of the first resist pattern (21) and the width (Wr2) of the second resist pattern (22) (e.g. the width difference ΔP based thereon) with high precision. Accordingly, by previously finding the correspondence relationship between the difference in the widths of the first and the second resist patterns (21, 22) (e.g. the width difference ΔP based thereon) and the phase difference (Δλ) between a first light and a second light, for instance, it is possible to actually specify the phase difference (Δλ) between the first light and the second light easily and accurately. In addition, by using the phase shift mask (1) according to this embodiment, it is possible to specify the phase difference (Δλ) without having to use any exclusive measuring device etc. Other than that, by using the phase shift mask (1) according to this embodiment, when measuring the phase differences (Δλ) with respect to multiple positions in a phase shift mask (1) etc., for instance, even under conditions in which the distance between the predetermined substrate (20) and the phase shift mask (1) at the time of exposure becomes slightly shifted from the focus distance due to a difference or distortion in the predetermined substrate 20, it is possible to measure the phase difference (Δλ) with little or no reduction in measuring precision.

In accordance with the exposure method according to this embodiment, the phase difference (Δλ) of a phase shift mask (1) having formed thereon a backing film (11a) processed into a first shape (e.g. a line-and-space pattern) which enables a first optical image to be formed on a predetermined substrate (20) that is the target of exposure, the first optical image capable of forming a first resist pattern (21) having a width (Wr1) that changes depending on the distance (Fm) from the predetermined substrate (20), and a semi-transmissive film processed into a second shape (e.g. a line-and-space pattern) which enables a second optical image to be formed on the predetermined substrate (20), the second optical image capable of forming a second resist pattern (22) having a width (Wr2) that changes depending on the distance (Fm) from the predetermined substrate (20) and on the thickness of the semi-transmissive film, can be specified accurately as mentioned above. Accordingly, by using this phase shift mask (1), an exposure process under accurate position control can be made possible.

In accordance with the method of manufacturing a semiconductor device according to this embodiment, the phase difference (Δλ) of a phase shift mask (1) having formed thereon a backing film (11a) that is processed into a first shape (e.g. a line-and-space pattern) which enables a first optical image to be formed on a predetermined substrate (20) that is the target of exposure, the first optical image capable of forming a first resist pattern (21) having a width (Wr1) that changes depending on the distance (Fm) from the predetermined substrate (20), and a semi-transmissive film processed into a second shape (e.g. a line-and-space pattern) which enables a second optical image to be formed on the predetermined substrate (20), the second optical image capable of forming a second resist pattern (22) having a width (Wr2) that changes depending on the distance (Fm) from the predetermined substrate (20) and on the thickness of the semi-transmissive film, can be specified accurately as mentioned above. Accordingly, by using this phase shift mask (1), it is possible to improve the process precision in manufacturing a semiconductor device, and as a result, the yield ratio of the semiconductor device can be improved.

In this particular embodiment, the phase shift mask 1 has multiple pattern groups (i.e., the pattern groups A and B in this embodiment) formed on a single mask substrate 10. However, this is not a limiting condition in the present invention, and it is also possible to adopt a phase shift mask in which only a single pattern group (e.g. the pattern group A) is formed on the mask substrate 10, for instance. In this case, the phase shift mask may be exposed while it is shifted by a predetermined distance (e.g. Dp+Wm) when using the horizontal mask position shifting function of an exposure apparatus, for instance, in order to have the first and second resist patterns correspond to multiple pattern groups formed on the predetermined substrate 20.

Embodiment 2

Now, a second embodiment of the present invention will be described in detail with reference to the drawings. In the following, the same reference numbers will be used for the structural elements that are the same as the first embodiment, and redundant explanations of those structural elements will be omitted.

In this embodiment, using a single phase shift mask 2, a predetermined substrate 20 will be exposed more than twice from different exposure mask positions Fm to form two typess of resist patterns on the predetermined substrate 20, and based on the width difference ΔP obtained based on these resist patterns, the phase difference Δλ will be specified. One of the two resist patterns (i.e., a third resist pattern) is formed, for instance, by disposing the phase shift mask 2 on an exposure mask position Fm1 ($=F_0+dF2$) that is shifted from a focus position $F_0$ by a predetermined distance dF2 away from the predetermined substrate. The other resist pattern (i.e., a fourth resist pattern) is formed, for instance, by disposing the phase shift mask 2 on an exposure mask position Fm2 ($=F_0+dF2$) that is shifted from a focus position $F_0$ by the predetermined distance dF2 toward the predetermined substrate. The width difference ΔP can be calculated based on the third and fourth resist patterns in the same way as in the phase difference specifying method in the first embodiment.

Structure of Phase Shift Mask 2

Figure 9A:
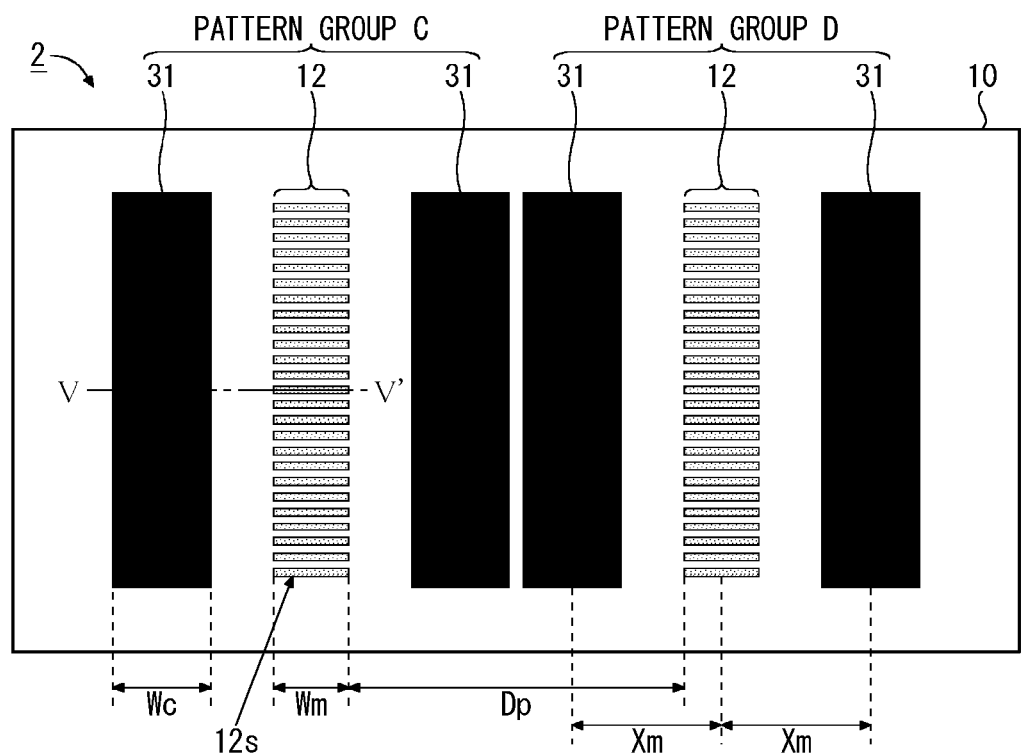
FIG. 9A is a plan view of a structure of a phase shift mask according to a second embodiment of the present invention.
Figure 9B:
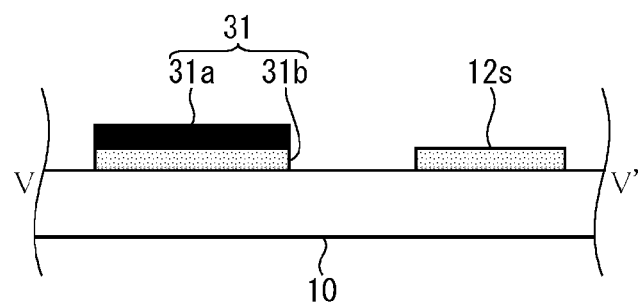
FIG. 9B is a sectional view of the structure of the phase shift mask according to the second embodiment of the present invention taken along a line V–V' shown in FIG. 9A.

First, the structure of the phase shift mask 2 according to this embodiment will be described in detail with reference to the drawings. FIG. 9A is a plan view of the structure of the phase shift mask 2. FIG. 9B is a sectional view of the structure of the phase shift mask 2 taken along a line V–V' shown in FIG. 9A. Here, the phase shift mask 2 is used while the upper surface thereof shown in FIG. 9B is facing one side of a predetermined substrate that serves as an exposure target.

As shown in FIG. 9A, the phase shift mask 2 has two or more second mask patterns 12 formed on a mask substrate 10 as in the first embodiment. The second mask patterns 12 are arranged at predetermined intervals Dp. In this description, as shown in FIG. 9A, a pattern group including one second mask pattern 12 is referred to as 'C' and a pattern group including the other second mask pattern 12 is referred to as 'D'.

In each of the pattern groups C and D, light interception patterns 31 are formed on both sides of the second mask pattern 12. Each light interception pattern 31 is larger than the second mask pattern 12. In other words, the width Wc of the light interception pattern 31 is wider than the width of the second mask pattern 12, and the length of the light interception pattern 31 is longer than the length of the second mask pattern 12. The distance between the center lines of the second mask pattern 12 and the light interception pattern 31 is the same as the distance between the center lines of the first mask pattern 11 and the second mask pattern 12 in the first embodiment.

As shown in FIG. 9A, the structure of each light interception patterns 31 includes a half-tone film 31b and a backing film 31a. The half-tone film 31b has the above mentioned shape and is formed on the mask substrate 10. The backing film 31a also has the above mentioned shape and is formed on the half-tone film 31b. However, the present invention is not limited to such arrangement, and it is also possible to have a structure in which that the backing film 31a is formed directly on the mask substrate 10.

As with the backing film 11a in the first embodiment, the backing film 31a may be a chrome (Cr) film, for instance. However, any kind of film can be applied as the backing film as long as it is a film made of a material which is nontransparent with respect to light. The following description will describe a situation in which a chrome (Cr) film is used as the backing film 31a. The backing film 31a can be made to a thickness of about 100 μm when a light wavelength is made to be 248 nm by applying a KrF excimer laser lithography, for instance. However, the backing film may also have different thickness.

As with the half-tone film 11b in the first embodiment, the half-tone film 31b may be a chrome oxide ($CrO_2$) film, an oxide film of molybdenum silicide (MoSi), a multilayer film including a chrome oxide film or an oxide film of molybdenum silicide, or the like. The following description will describe a situation in which a chrome oxide ($CrO_2$) film is used as the half-tone film. The thickness of the half-tone film 31b is the same as the second mask pattern 12, which will be described below.

Since the rest of the structure is the same as the structure of the phase shift mask 1 of the first embodiment, a detailed description thereof will be omitted here. With respect to the duty ratio of the second mask pattern, it is not necessary to satisfy the second condition mentioned above.

In this embodiment, the predetermined substrate 20 is exposed twice using the above-mentioned phase shift mask 2. The first exposure will be executed by disposing the phase shift mask 2 on the exposure mask position Fm1, which is a position shifted from the focus position $F_0$ away from the predetermined substrate 20 by the predetermined distance dF2. At this time, light penetrating through the second mask pattern 12 will be referred to as a third light, and an image formed on the predetermined substrate by the third light will be referred to as a third optical image. The second exposure will be executed by disposing the phase shift mask 2 on the exposure mask position Fm2, which is a position shifted from the focus position $F_0$ toward the predetermined substrate 20 by the predetermined distance dF2. In the second exposure, however, the phase shift mask 2 should be disposed at a position shifted from the optical axis toward the direction in which the pattern groups C and D are arranged by a distance Xm, which is the distance between the center lines of the second mask pattern 12 and the light interception pattern 31. Thereby, at the time of second exposure, a shadow made by the light interception pattern 31 will cover the third resist pattern formed by the first exposure. Therefore, it is possible to prevent the third resist pattern from being re-exposed. A light penetrating through the second mask pattern at the second exposure will be referred to as a fourth light, and an image formed on the predetermined substrate by the fourth light will be referred to as a fourth optical image.

Figure 10:
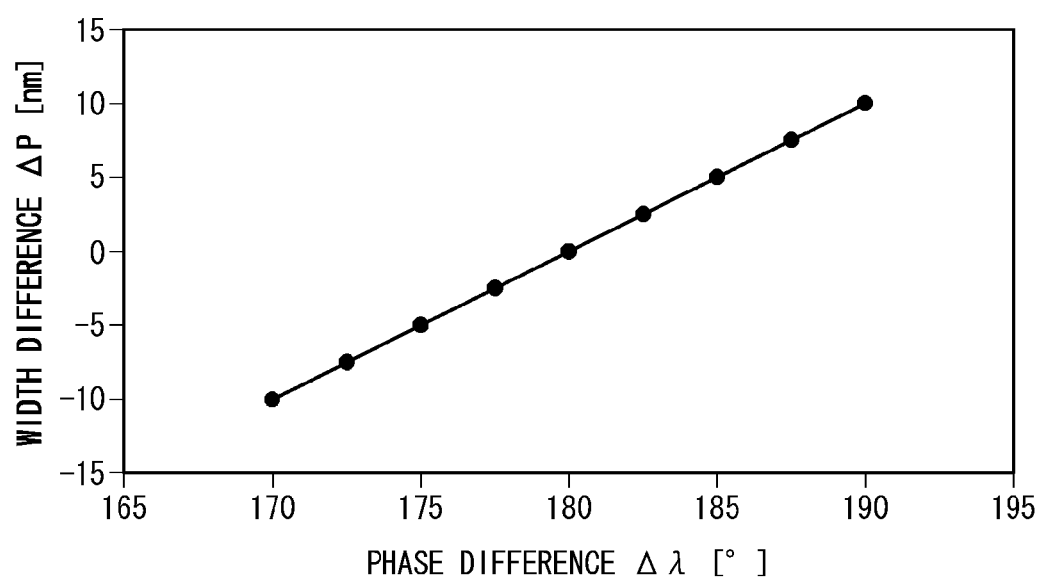
FIG. 10 is a graph of the relationship between a width difference $\Delta P$ and a phase difference $\Delta\lambda$ according to the second embodiment of the present invention.

Relationship between Exposure Mask Position Fm and Width Wr of Third/Fourth Resist Pattern In this embodiment, the relationship between the exposure mask position Fm and the width Wr3/Wr4 of the third resist pattern/the fourth resist pattern is the same as the relationship between the exposure mask position Fm and the width Wr1/Wr2 of the first resist pattern/the second resist pattern (shown in FIG. 2). In this embodiment, the exposure mask position Fm2 at the time when the fourth resist pattern is formed is symmetric with the exposure mask position Fm1 at the time when the third resist pattern is formed, with respect to the focus position $F_0$. Therefore, in this embodiment, the relationship between the width difference ΔP and the phase difference Δλ becomes linear, as shown in FIG. 10.

Accordingly, in this embodiment, it is possible to specify the phase difference Δλ based on the width difference ΔP easily and with high precision. A method of calculating the width difference ΔP will be described in detail below. The correspondence line of the width difference ΔP and the phase difference Δλ can be obtained in advance through appropriate experimentation or simulation as in the first embodiment. Moreover, in this embodiment, it is preferable that the exposure mask positions Fm1 and Fm2 are set to positions where the correspondence line shown in FIG. 10 becomes the steepest within a range fulfilling the first and second conditions as mentioned in the first embodiment.

Structure of Third and Fourth Resist Patterns

Now, structures of the third and fourth resist patterns formed on the predetermined substrate using the phase shift mask 2 according to the second embodiment will be described with reference to the drawings. In the following, the third or fourth optical image formed on the predetermined substrate by the third or fourth light $\lambda_{180}$ will be referred to as a third or fourth optical image (180°), the third or fourth optical image formed on the predetermined substrate by the third or fourth light $\lambda_{175}$ will be referred to as a third or fourth optical image (175°), and the third or fourth optical image formed on the predetermined substrate by the third or fourth light $\lambda_{185}$ will be referred to as a third or fourth optical image (185°). Moreover, the third or fourth resist pattern formed on the predetermined substrate by the third or fourth optical image (180°) will be referred to as a third resist pattern $23_{180}$ or a fourth resist pattern $24_{180}$, the third or fourth resist pattern formed on the predetermined substrate by the third or fourth optical image (175°) will be referred to as a third resist pattern $23_{175}$ or a fourth resist pattern $24_{175}$, and the third or fourth resist pattern formed on the predetermined substrate by the third or fourth optical image (185°) will be referred to as a third resist pattern $23_{185}$ or a fourth resist pattern $24_{185}$.

Phase Shift Difference Δλ is 180°

Figure 11A:
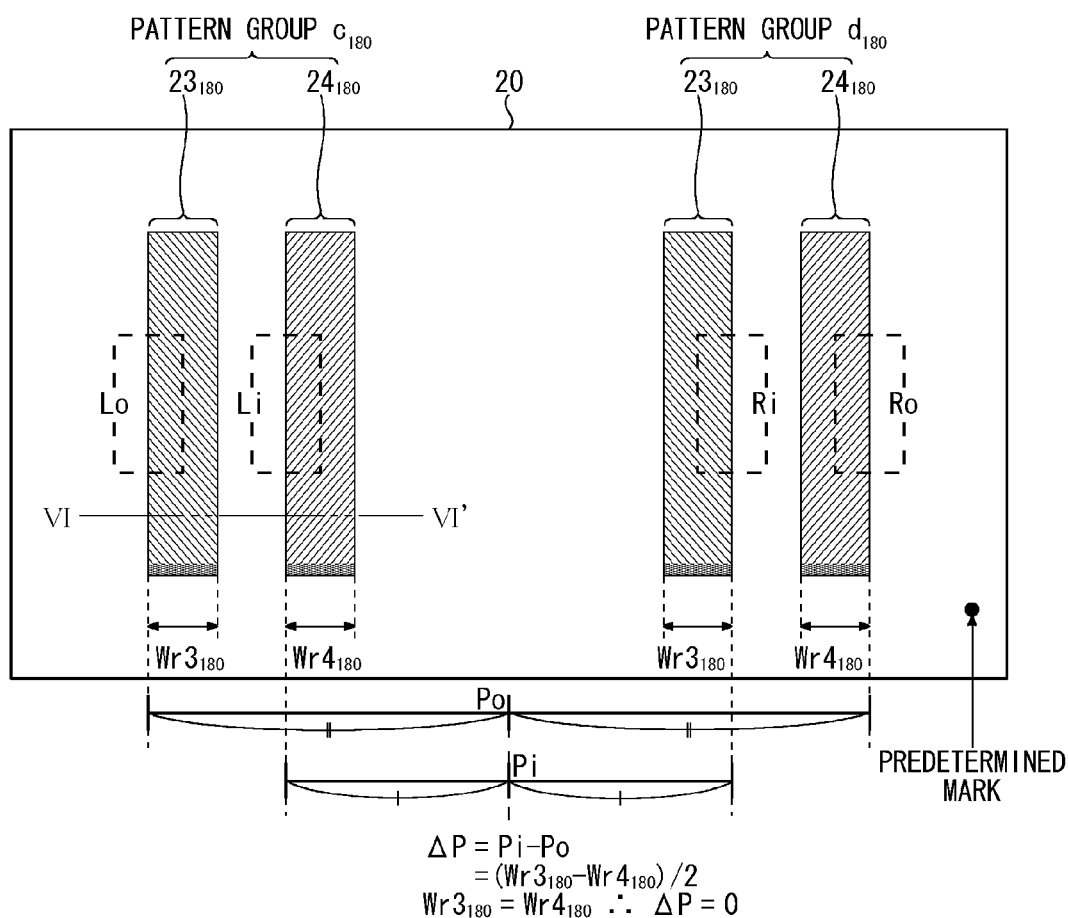
FIG. 11A is a plan view showing the structures of third and fourth resist patterns $23_{180}$ and $24_{180}$ according to the second embodiment of the present invention.
Figure 11B:
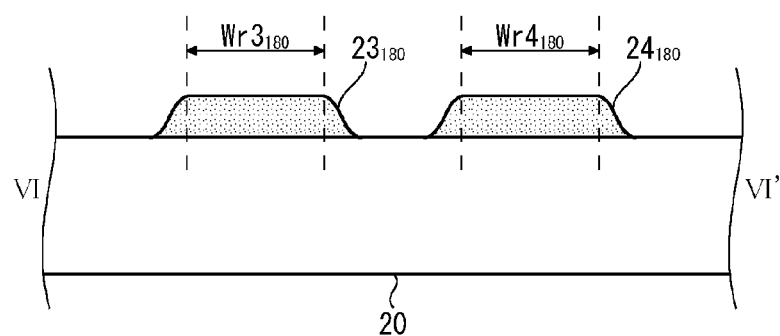
FIG. 11B is a sectional view showing the structures of the third and fourth resist patterns $23_{180}$ and $24_{180}$ taken along a line VI–VI' shown in FIG. 11A.

FIG. 11A is a plan view showing the structures of the third and fourth resist patterns $23_{180}$ and $24_{180}$ which are formed on the predetermined substrate 20 when the phase shift mask 2 is positioned at the exposure mask positions Fm1 and Fm2, and FIG. 11B is a sectional view showing the structures of the third and fourth resist patterns $23_{180}$ and $24_{180}$ taken along a line VI–VI' shown in FIG. 11A. At the time of exposure, the predetermined substrate 20 is supposed to have a positive type photo-resist being applied thereon. In this case, however, it is also possible to apply a negative type photo-resist on the predetermined substrate 20.

In FIG. 11A, a pattern group $c_{180}$ is being formed by having the pattern group C in FIG. 9A projected onto the predetermined substrate 20 twice. Likewise, a pattern group $d_{180}$ is being formed by having the pattern group D in FIG.

9A projected onto the predetermined substrate 20 twice. The third resist pattern $23_{180}$ is formed by the second mask pattern 12 in FIG. 9A when the phase shift mask 2 is positioned at the exposure mask position Fm1, and the fourth resist pattern $24_{180}$ is formed by the second mask pattern 12 in FIG. 9A when the phase shift mask 2 is positioned at the exposure mask position Fm2.

In situations in which the phase shift mask 2 having the second mask pattern 12 with the thickness of $D_{180}$ is used, as can be seen from FIG. 2 in the first embodiment, when the phase shift mask 2 is positioned at the exposure mask position Fm1 (=$F_0$−+dF2) and when the phase shift mask 2 is positioned at the exposure mask position Fm2 (=$F_0$−dF2), the width $Wr3_{180}$ of the third resist pattern $23_{180}$ becomes the same as the width $Wr4_{180}$ of the fourth resist pattern $24_{180}$.

Phase Shift Difference Δλ is 175°

Figure 12A:
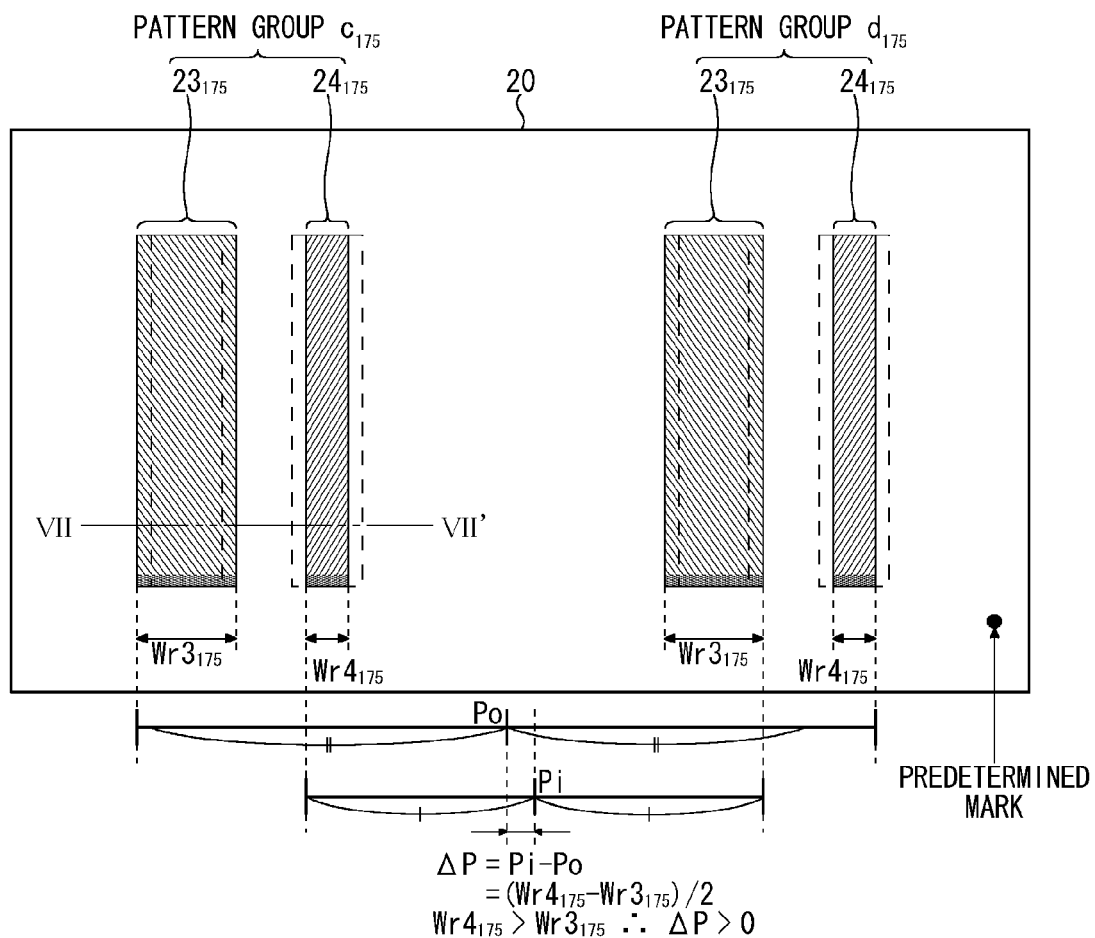
FIG. 12A is a plan view showing the structures of third and fourth resist patterns $23_{175}$ and $24_{175}$ according to the second embodiment of the present invention.
Figure 12B:
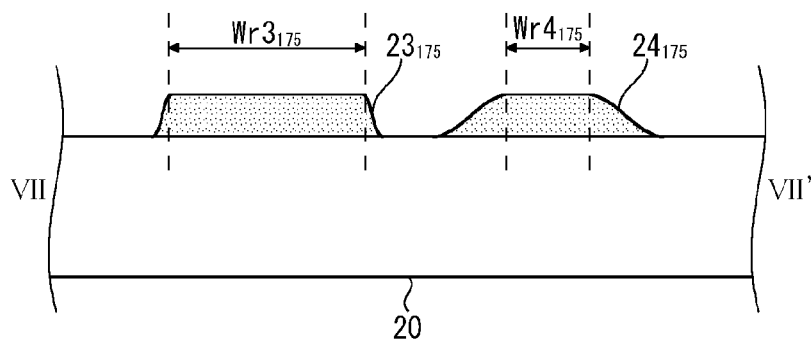
FIG. 12B is a sectional view showing the structures of the third and fourth resist patterns $23_{175}$ and $24_{175}$ taken along a line VII–VII' shown in FIG. 12A.

Now, structures of the third and fourth resist patterns $23_{175}$ and $24_{175}$ formed on the predetermined substrate 20 when the phase shift mask 2 is positioned at the exposure mask positions Fm1 and Fm2 will be described in detail with reference to the drawings. FIG. 12A is a plan view showing the structures of the third and fourth resist patterns $23_{175}$ and $24_{175}$, and FIG. 12B is a sectional view showing the structures of the third and fourth resist patterns $23_{175}$ and $24_{175}$ taken along a line VII–VII' shown in FIG. 12A. As in the case described with reference to FIG. 11A and FIG. 11B, at the time of exposure, the predetermined substrate 20 is supposed to have a positive type photo-resist being applied thereon.

In FIG. 12A, a pattern group $c_{175}$ is being formed by having the pattern group C in FIG. 9A projected onto the predetermined substrate 20 twice. Likewise, a pattern group $d_{175}$ is being formed by having the pattern group D in FIG. 9A projected onto the predetermined substrate 20 twice. The third resist pattern $23_{175}$ is formed by the second mask pattern 12 in FIG. 9A when the phase shift mask 2 is positioned at the exposure mask position Fm1, and the fourth resist pattern $24_{175}$ is formed by the second mask pattern 12 in FIG. 9A when the phase shift mask 2 is positioned at the exposure mask position Fm2.

In situations in which the phase shift mask 2 having the second mask pattern 12 with the thickness of $D_{175}$ is used, as can be seen from FIG. 2 in the first embodiment, the relation curve between the width $Wr3_{175}/Wr4_{175}$ of the third resist pattern $23_{175}$/the fourth resist pattern $24_{175}$ and the exposure mask position Fm is shifted to the left. Therefore, the width $Wr3_{175}$ of the third resist pattern $23_{175}$ which is formed when the phase shift mask 2 is positioned at the exposure mask position Fm1 will become larger than the width $Wr3_{180}$ of the third resist pattern $23_{180}$ which is formed when the phase shift mask 2 is positioned at the exposure mask position Fm1. On the other hand, the width $Wr4_{175}$ of the fourth resist pattern $24_{175}$ which is formed when the phase shift mask 2 is positioned at the exposure mask position Fm2 will become smaller than the width $Wr4_{180}$ of the fourth resist pattern $24_{180}$ which is formed when the phase shift mask 2 is positioned at the exposure mask position Fm2.

Phase Shift Difference Δλ is 185°

Figure 13A:
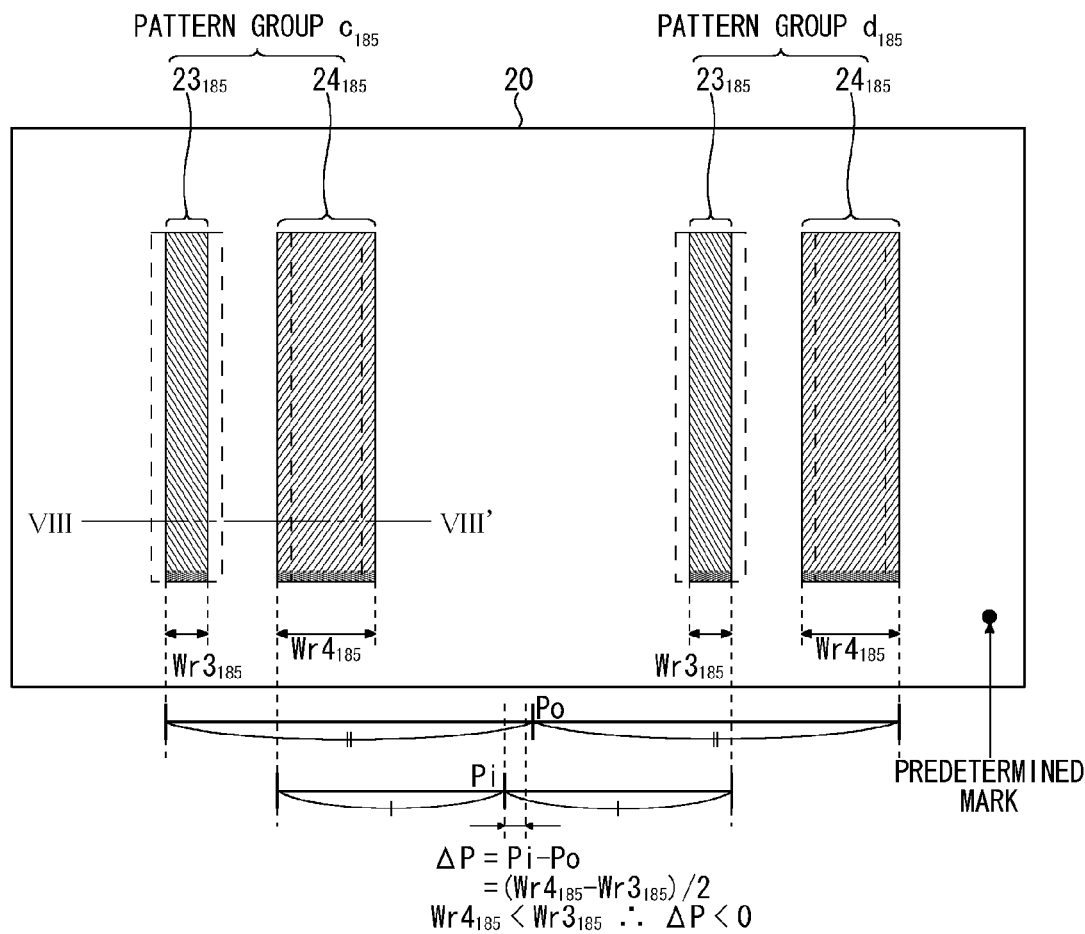
FIG. 13A is a plan view showing the structures of the third and fourth resist patterns $23_{185}$ and $24_{185}$ according to the second embodiment of the present invention.
Figure 13B:
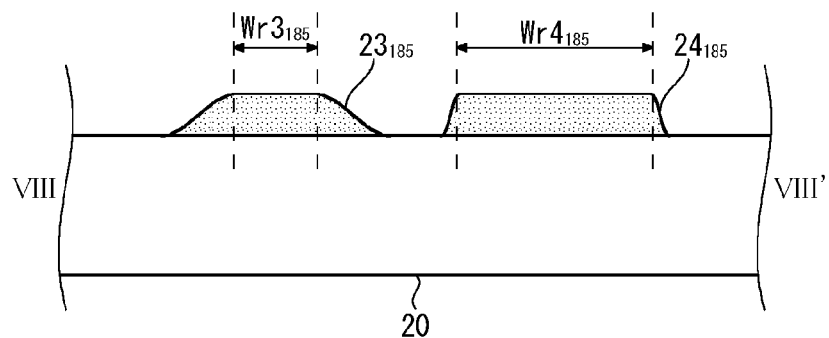
FIG. 13B is a sectional view showing the structures of the third and fourth resist patterns $23_{185}$ and $24_{185}$ taken along a line VIII–VIII' shown in FIG. 13A.

Now, structures of the third and fourth resist patterns $23_{185}$ and $24_{185}$ formed on the predetermined substrate 20 when the phase shift mask 2 is positioned at the exposure mask positions Fm1 and Fm2 will be described in detail with reference to the drawings. FIG. 13A is a plan view showing the structures of the third and fourth resist patterns $23_{185}$ and $24_{185}$, and FIG. 13B is a sectional view showing the structures of the third and fourth resist patterns $23_{185}$ and $24_{185}$ taken along a line VIII–VIII' shown in FIG. 13A. As in the case described with reference to FIG. 11A and FIG. 11B, at the time of exposure, the predetermined substrate 20 is supposed to have a positive type photo-resist being applied thereon.

In FIG. 13A, a pattern group $c_{185}$ is being formed by having the pattern group C in FIG. 9A projected onto the predetermined substrate 20 twice. Likewise, a pattern group $d_{185}$ is being formed by having the pattern group D in FIG. 9A projected onto the predetermined substrate 20 twice. The third resist pattern $23_{185}$ is formed by the second mask pattern 12 in FIG. 9A when the phase shift mask 2 is positioned at the exposure mask position Fm1, and the fourth resist pattern $24_{185}$ is formed by the second mask pattern 12 in FIG. 9A when the phase shift mask 2 is positioned at the exposure mask position Fm2.

In situations in which the phase shift mask 2 having the second mask pattern 12 with the thickness of $D_{185}$ is used, as can be seen from FIG. 2 in the first embodiment, the relation curve between the width $Wr3_{185}/Wr4_{185}$ of the third resist pattern $23_{185}$/the fourth resist pattern $24_{185}$ and the exposure mask position Fm is shifted to the right. Therefore, the width $Wr3_{185}$ of the third resist pattern $23_{185}$ which is formed when the phase shift mask 2 is positioned at the exposure mask position Fm1 will become smaller than the width $Wr3_{180}$ of the third resist pattern $23_{180}$ which is formed when the phase shift mask 2 is positioned at the exposure mask position Fm1. On the other hand, the width $Wr4_{185}$ of the fourth resist pattern $24_{185}$ which is formed when the phase shift mask 2 is positioned at the exposure mask position Fm2 will become larger than the width $Wr4_{180}$ of the fourth resist pattern $24_{180}$ which is formed when the phase shift mask 2 is positioned at the exposure mask position Fm2.

Phase Difference Specifying Method

Now, a method of specifying the phase difference Δλ based on the third resist pattern $23_{180}$, $23_{175}$ or $23_{185}$ and the fourth resist pattern $24_{180}$, $24_{175}$ or $24_{185}$ will be described.

In specifying the phase difference Δλ, first, images of the outlines of the third resist pattern $23_{180}$, $23_{175}$ or $23_{185}$ and the fourth resist pattern $24_{180}$, $24_{175}$ or $24_{185}$ are taken by an imaging device such as an optical superimposing measuring instrument, for instance. In the following explanation, the third resist patterns $23_{180}$, $23_{175}$ and $23_{185}$ will be referred to simply as the third resist pattern 23 where appropriate. Likewise, the third resist patterns $23_{180}$, $23_{175}$ and $23_{185}$ will be referred to simply as the third resist pattern 23 where appropriate. In addition, the pattern groups $c_{180}$, $c_{175}$ and $d_{185}$ will be referred to simply as the pattern group c where appropriate. Likewise, the pattern groups $d_{180}$, $d_{175}$ and $d_{185}$ will be referred to simply as the pattern group d where appropriate.

When the images of the outlines of the third and the fourth resist patterns 23 and 24 are taken, certain relative positions with reference to a predetermined mark provided within the structure of the predetermined substrate 20 shown in FIG. 11A and FIG. 11B are specified with respect to imaging regions Lo, Li, Ri and Ro, respectively. Here, when the pattern group c is disposed at the left side of the pattern group d, the imaging region Lo will include a portion of the outline in the left side of the third resist pattern 23 in the pattern group c, and the imaging region Li will include a portion of the outline in the left side of the fourth resist pattern 24 in the pattern group c. Likewise, the imaging region Ro will include a portion of the outline in the right side of the fourth resist pattern 24 in the pattern group d, and the imaging region Ri will include a portion of the outline in the right side of the third resist pattern 23 in the pattern group d.

Next, the portion of outline in the left side of the third resist pattern 23 in the pattern group c is identified based on the image of the imaging region Lo through an image recognition process, for instance, and a position of this identified outline portion in a horizontal direction with respect to the predetermined mark (hereinafter to be referred to as a fifth outline position) will be specified. In the meantime, the portion of the outline in the right side of the fourth resist pattern 24 in the pattern group d is identified based on the image of the imaging region Ro, and the position of this identified outline portion in a horizontal direction with respect to the predetermined mark (hereinafter to be referred to as a sixth outline position) will be specified. Then, based on the specified fifth and sixth outline positions, the midpoint position between these two will be specified (hereinafter to be referred to as a third midpoint position Po). In this description, 'the horizontal direction' is the direction in which the pattern groups c and d are arranged (i.e., the horizontal direction in the drawings).

Next, the portion of outline in the left side of the fourth resist pattern 24 in the pattern group c is identified based on the image of the imaging region Li through an image recognition process, for instance, and the position of this identified outline portion in the horizontal direction with respect to the predetermined mark (hereinafter to be referred to as a seventh outline position) will be specified. In the meantime, the portion of the outline in the right side of the third resist pattern 23 in the pattern group d is identified based on the image of the imaging region Ri, and the position of this identified outline portion in the horizontal direction with respect to the predetermined mark (hereinafter to be referred to as a eighth outline position) will be specified. Then, based on the specified seventh and eighth outline positions, the midpoint position between these two will be specified (hereinafter to be referred to as a fourth midpoint position Pi). In this description, 'the horizontal direction' is the direction in which the pattern groups c and d are arranged (i.e., the horizontal direction in the drawings).

After the third midpoint position Po and the fourth midpoint position Pi are determined in this way, the width difference $\Delta P$ (=Pi−Po) between the two midpoint positions is to be calculated.

Here, if the thickness of the second mask pattern 12 is $D_{180}$, the width $Wr3_{180}$ of the third resist pattern $23_{180}$ and the width $Wr4_{180}$ of the fourth resist pattern $24_{180}$ are supposed to be the same (q.v. FIG. 11A). Accordingly, the width difference $\Delta P$ (=Pi−Po) between the third midpoint position Po and the fourth midpoint position Pi in a horizontal direction will become '0'.

However, when the thickness of the second mask pattern 12 is smaller than the thickness $D_{180}$ (e.g., thickness $D_{175}$), for instance, the width $Wr3_{175}$ of the third resist pattern $23_{175}$ will become larger than the width $Wr3_{180}$ of the third resist pattern $23_{180}$, and the width $Wr4_{175}$ of the fourth resist pattern $24_{175}$ will become smaller than the width $Wr4_{180}$ of the fourth resist pattern $24_{180}$ as shown in FIG. 12A. Therefore, the third midpoint position Po determined in the above-described way will be shifted in a leftward direction by half of the value obtained by subtracting half the width $Wr3_{175}$ from half the width $Wr4_{175}$, i.e., by $(Wr4_{175}-Wr3_{175})/4$, as compared to when the phase shift mask 2 having the second mask pattern 12 with the thickness $D_{180}$ is used. On the other hand, the fourth midpoint position Pi will be shifted in a rightward direction by half of the value obtained by subtracting half the width $Wr3_{175}$ from half the width $Wr4_{175}$, i.e., by $(Wr4_{175}-Wr3_{175})/4$, as compared to when the phase shift mask 2 having the second mask pattern 12 with the thickness $D_{180}$ is used. Accordingly, the width difference $\Delta P$ (=Pi−Po) between the third midpoint position Po and the fourth midpoint position Pi in a horizontal direction will become $(Wr4_{175}-Wr3_{175})/2$ (>0).

Moreover, when the thickness of the second mask pattern 12 is larger than the thickness $D_{180}$ (e.g., thickness $D_{185}$), the width $Wr3_{185}$ of the third resist pattern $23_{185}$ will become smaller than the width $Wr3_{180}$ of the third resist pattern $23_{180}$ as shown in FIG. 13A. Therefore, the third midpoint position Po determined in the above-described way will be shifted in a rightward direction by half of the value obtained by subtracting half the width $Wr3_{185}$ from half the width $Wr3_{185}$, i.e., by $(Wr4_{185}-Wr3_{185})/4$, as compared to when the phase shift mask 2 having the second mask pattern 12 with the thickness $D_{180}$ is used. On the other hand, the fourth midpoint position Pi will be shifted in a leftward direction by half of the value obtained by subtracting half the width $Wr3_{185}$ from half the width $Wr4_{185}$, i.e., by $(Wr4_{185}-Wr3_{185})/4$, as compared to when the phase shift mask 2 having the second mask pattern 12 with the thickness $D_{180}$ is used. Accordingly, the width difference $\Delta P$ (=Pi−Po) between the third midpoint position Po and the fourth midpoint position Pi in a horizontal direction will become $-(Wr4_{185}-Wr3_{185})/2$ (<0).

In this way, after the width difference $\Delta P$ is specified, the phase difference $\Delta \lambda$ is to be specified based on the correspondence relationship (q.v. FIG. 10) between the width difference $\Delta P$ and the phase difference $\Delta \lambda$ which was obtained previously.

Method of Manufacturing Phase Shift Mask 2

Now, a method of manufacturing the phase shift mask 2 according to this embodiment will be described in detail with reference to FIGS. 14A to 14E. FIGS. 14A to 14E are diagrams showing processes of manufacturing the phase shift mask 2. In each of FIGS. 14A to 14E, a section corresponding to the V–V' section in FIG. 9A under each process is illustrated.

Figure 14A:
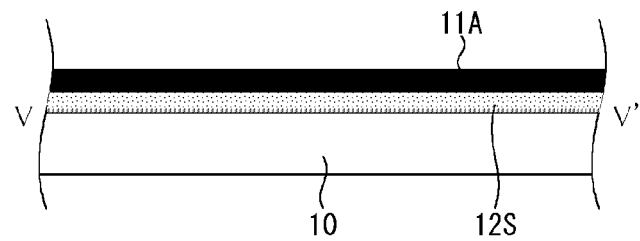
FIGS. 14A to 14E are diagrams showing processes of manufacturing the phase shift mask according to the second embodiment of the present invention.

In this manufacturing method, first, a mask substrate 10 made of glass (e.g. synthetic quartz etc.) with a thickness of 6.35 mm is prepared. Then, as shown in FIG. 14A, chrome oxide ($CrO_2$) and chrome (Cr) are deposited sequentially to form a chrome oxide ($CrO_2$) film 12S and a chrome (Cr) film 11A sequentially on the mask substrate 10. In forming the chrome oxide ($CrO_2$) film 12S and the chrome (Cr) film 11A, it is possible to use a CVD (chemical vapor deposition) method, for instance. As for the thicknesses of the chrome oxide ($CrO_2$) film 12S and the chrome (Cr) film 11A, both of them can be formed to a thickness of 100 μm, for instance.

Figure 14B:
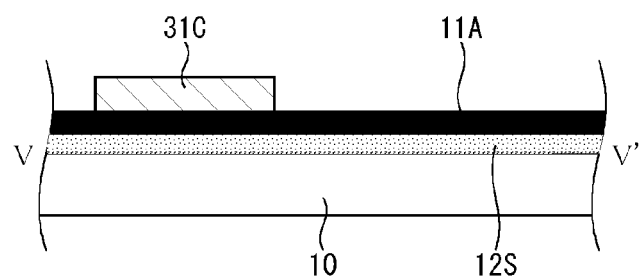

Then, after spin-coating a predetermined resist solution on the chrome (Cr) film 11A, a resist pattern 31C having the same shape as the light interception pattern 31 is formed using existing exposure and development processes, as shown in FIG. 14B.

Figure 14C:
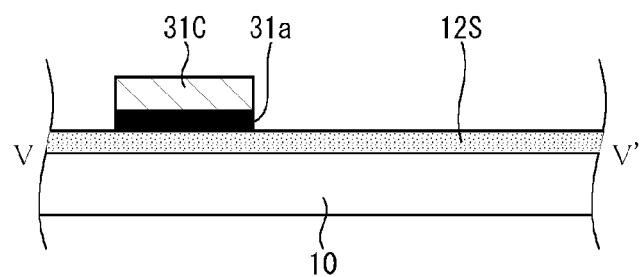

Then, using an existing etching method, for instance, the chrome (Cr) film 11A is etched while the resist pattern 31C is used as a mask. By this arrangement, the chrome (Cr) film 11A is processed into the same shape as the light interception pattern 31 as shown in FIG. 14C. After that, the resist pattern 31C will be removed.

Figure 14D:
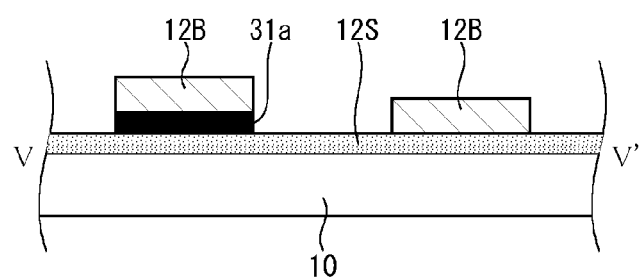

Then, after spin-coating a predetermined resist solution on the light interception pattern 31 and the exposed chrome oxide ($CrO_2$) film 12S, resist patterns 12B having the same shapes as the light interception pattern 31 and the second mask pattern 12 are formed, using existing exposure and development processes, as shown in FIG. 14D.

Figure 14E:
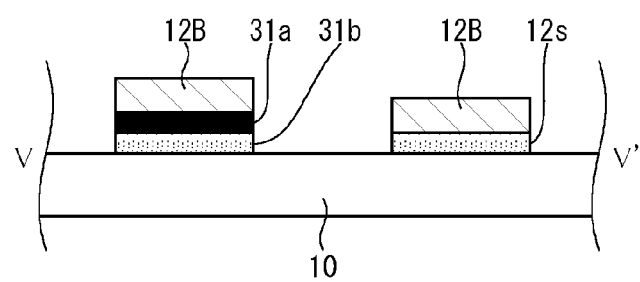

Then, using an existing etching method, for instance, the chrome oxide ($CrO_2$) film 12S is etched, while the resist patterns 12B are used as masks, to be processed into the same shapes as the light interception pattern 31 and the second mask pattern 12, as shown in FIG. 14E. By such arrangement, the light interception pattern 31 made up of the backing film 31a and a half-tone film 31b, and the second mask pattern 12 made up of a half-tone film 12s, can be obtained. Then, by removing the resist patterns 12B, the phase shift mask 2 as shown in FIG. 9A and FIG. 9B can be obtained.

Method of Manufacturing Semiconductor Device

A method of forming a semiconductor device including the exposing method using the phase shift mask 2 according to this embodiment is the same as the first embodiment of the present invention, and a redundant explanation of this manufacturing method will be omitted here.

As described above, in accordance with the phase difference specifying method according to this embodiment, third and the fourth resist patterns (23, 24) can be simply formed on a predetermined substrate (20) using production devices (e.g. exposure apparatus, resist coater, imaging device, etc.) which are used in normal photolithography. Furthermore, the third and the fourth resist patterns (23, 24) formed on the predetermined substrate (20) can have their shapes specified based on images obtained using a typical imaging device such as an optical superimposing measuring device etc. Moreover, by specifying the positions (e.g. the positions of the outline portions) of the third and the fourth resist patterns (23, 24) based on the obtained images, it is possible to easily calculate the difference between the width (Wr3) of the third resist pattern (23) and the width (Wr4) of the fourth resist pattern (24) (e.g. the width difference $\Delta P$ based thereon) with high precision. Accordingly, by previously finding the correspondence relationship between the difference in the widths of the third and the fourth resist patterns (23, 24) (e.g. the width difference $\Delta P$ based thereon) and the phase difference ($\Delta \lambda$) between a third light and a fourth light, for instance, it is possible to actually specify the phase difference ($\Delta \lambda$) between the third light and the fourth light easily and accurately. In addition, according to this embodiment, it is possible to specify the phase difference ($\Delta \lambda$) without having to use any exclusive measuring device etc.

In accordance with the method of manufacturing a phase shift mask according to this embodiment, a semi-transmissive film processed into a first shape (e.g. a line-and-space pattern) which enables an optical image to be formed on a predetermined substrate (20) that is the target of exposure, the optical image capable of forming resist patterns (23, 24) having widths (Wr3, Wr4) which change depending on the distance (Fm) from the predetermined substrate (20) and on the thickness of the semi-transmissive film, is formed on a phase shift mask (2). Using this phase shift mask (2) together with production devices (e.g. exposure apparatus, resist coater, imaging device, etc.) used in normal photolithography, the resist patterns (23, 24) having the widths (Wr3, Wr4) which change depending on the distance (Fm) from the predetermined substrate (20) and on the thickness of the semi-transmissive film can be easily formed on the predetermined substrate (20). The resist patterns (23, 24) formed on the predetermined substrate (20) in this way can have their shapes specified based on images obtained using a typical imaging device such as an optical superimposing measuring device etc. Here, by disposing the phase shift mask (2) manufactured according to this embodiment at different positions (Fm1, Fm2) along the optical axis, for instance, it is possible to form the resist patterns (23, 24) with different widths on the predetermined substrate (20). Furthermore, by obtaining images of the resist patterns (23, 24) and specifying the positions (e.g. the positions of the outline portions) of the resist patterns (23, 24) based on the obtained images, it is possible to easily calculate the difference between the widths of these resist patterns (e.g. a difference $\lambda P$ based on it) with high precision. Accordingly, by previously finding the correspondence relationship between the difference in the widths of these resist patterns (23, 24) (e.g. the difference $\lambda P$ based thereon) and the phase difference ($\Delta \lambda$) between a third light and a fourth light, for instance, it is possible to actually specify the phase difference ($\Delta \lambda$) between the third light and the fourth light easily and accurately. In addition, by using the phase shift mask (2) according to this embodiment, it is possible to specify the phase difference ($\Delta \lambda$) without having to use any exclusive measuring device etc.

In accordance with the phase shift mask according to this embodiment, a phase shift mask (2) has a mask pattern (12) formed thereon that is made up of a semi-transmissive film processed into a first shape (e.g. a line-and-space pattern) which enables a second optical image to be formed on a predetermined substrate (20) that is the target of exposure, the second optical image capable of forming resist patterns (23, 24) having widths (Wr3, Wr4) which change depending on the distance (Fm) from the predetermined substrate (20) and on the thickness of the semi-transmissive film. Using such phase shift mask (2) together with production devices (e.g. exposure apparatus, resist coater, imaging device, etc.) used in normal photolithography, the resist patterns (23, 24) having the widths (Wr3, Wr4) which change depending on the distance (Fm) from the predetermined substrate (20) and on the thickness of the semi-transmissive film can be easily formed on the predetermined substrate (20). The resist patterns (23, 24) formed on the predetermined substrate (20) in this way can have their shapes specified based on images obtained using a typical imaging device such as an optical superimposing measuring device etc. Here, by disposing the phase shift mask (2) according to this embodiment at different positions (Fm1, Fm2) along the optical axis, for instance, it is possible to form the resist patterns (23, 24) with different widths (Wr3, Wr4) on the predetermined substrate (20). Furthermore, by obtaining images of the resist patterns (23, 24) and specifying the positions (e.g. positions of outline parts) of the resist patterns (23, 24) based on the obtained images, it is possible to easily calculate the difference between the widths of these resist patterns (e.g. the width difference $\Delta P$ based thereon) with high precision. Accordingly, by previously finding the correspondence relationship between the difference in the widths of these resist patterns (23, 24) (e.g. the difference $\Delta P$ based thereon) and the phase difference ($\Delta \lambda$) between a third light and a fourth light, for instance, it is possible to actually specify the phase difference ($\Delta \lambda$) between the third light and the fourth light easily and accurately. In addition, by using the phase shift mask according to this embodiment, it is possible to specify the phase difference ($\Delta \lambda$) without having to use any exclusive measuring device etc.

In accordance with the exposure method according to this embodiment, a phase difference ($\Delta \lambda$) of a phase shift mask (2) having formed thereon a mask pattern (12) made up of a semi-transmissive film processed into a first shape (e.g. a line-and-space pattern) which enables a second optical image to be formed on a predetermined substrate (20) that is the target of exposure, the second optical image capable of forming resist patterns (23, 24) having widths (Wr3, Wr4) which change depending on the distance (Fm) from the predetermined substrate (20) and on the thickness of the semi-transmissive film, can be specified accurately as mentioned above. Accordingly, by using this phase shift mask (2), an exposure process under accurate position control can be made possible.

In accordance with the method of manufacturing a semiconductor device according to this embodiment, the phase difference ($\Delta\lambda$) of a phase shift mask (2) having a mask pattern (12) formed thereon made up of a semi-transmissive film processed into a first shape (e.g. a line-and-space pattern) which enables a second optical image to be formed on a predetermined substrate (20) being a target of exposure, the second optical image capable of forming resist patterns (23, 24) having widths (Wr3, Wr4) which change depending on the distance (Fm) from the predetermined substrate (20) and on the thickness of the semi-transmissive film, can be specified accurately as mentioned above. Accordingly, by using this phase shift mask (2), it is possible to improve process precision in manufacturing a semiconductor device, and as a result, the yield ratio of the semiconductor device can be improved.

In this particular embodiment, the phase shift mask 2 has multiple pattern groups (i.e., the pattern groups C and D in this embodiment) formed on a single mask substrate 10. However, this is not a limiting condition in the present invention, and it is also possible to adopt a phase shift mask where only a single pattern group (e.g. the pattern group C) is formed on the mask substrate 10, for instance. In this case, the phase shift mask may be exposed while it is shifted by a predetermined distance (e.g. Dp+Wm) when using a horizontal mask position shifting function of an exposure apparatus, for instance, in order to have the third and fourth resist patterns correspond to multiple pattern groups formed on the predetermined substrate 20.

Embodiment 3

Now, a third embodiment of the present invention will be described in detail with reference to the drawings. In the following, the same reference numbers will be used for the structural elements that are the same as the first or second embodiment, and redundant explanations of those structural elements will be omitted.

In this embodiment, as in the case of the second embodiment, by using a single phase shift mask 3, a predetermined substrate 20 will be exposed more than twice from different exposure mask positions Fm to form two types of resist patterns on the predetermined substrate 20, and based on the width difference $\Delta P$ obtained from these resist patterns, the phase difference $\Delta\lambda$ will be specified. One of the two resist patterns (i.e., a third resist pattern as in the second embodiment) is formed, for instance, by disposing the phase shift mask 3 on an exposure mask position Fm1 (=$F_0$+dF2) that is shifted from a focus position $F_0$ away from the predetermined substrate by a predetermined distance dF2. The other resist pattern (i.e., a fourth resist pattern as in the second embodiment) is formed, for instance, by disposing the phase shift mask 3 on an exposure mask position Fm2 (=$F_0$+dF2) that is shifted from a focus position $F_0$ toward the predetermined substrate by the predetermined distance dF2. The width difference $\Delta P$ can be calculated based on the third and fourth resist patterns in the same way as in the phase difference specifying method in the first embodiment.

In the meantime, in this embodiment, by using a function of the exposure apparatus in order to set up an exposure region (also called a blind function), it is possible to prevent the third resist pattern from being re-exposed. Accordingly, in this embodiment, it is not necessary to use the light interception pattern 31 of the phase shift mask 2 as used in the second embodiment.

Structure of Phase Shift Mask 3

Figure 15A:
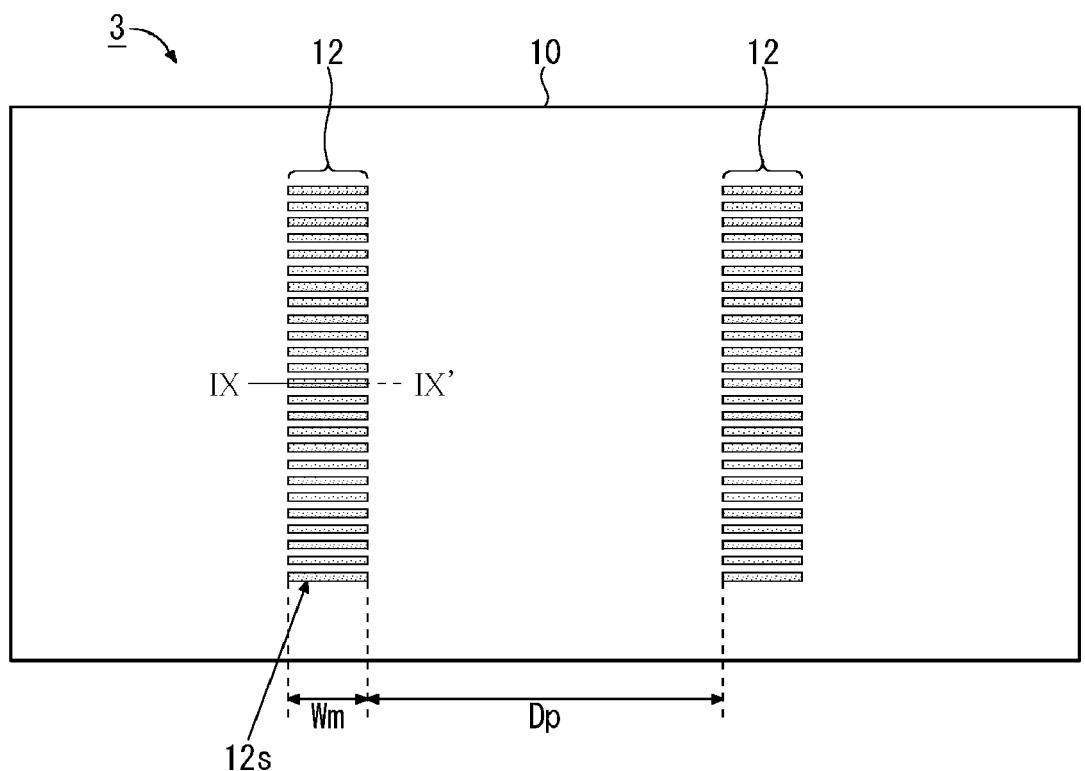
FIG. 15A is a plan view of the structure of a phase shift mask according to a third embodiment of the present invention.
Figure 15B:
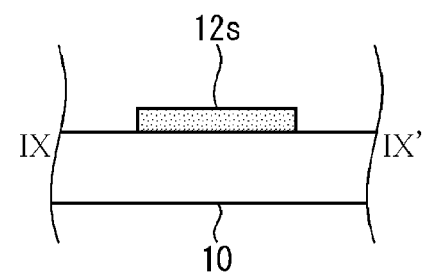
FIG. 15B is a sectional view of the structure of the phase shift mask according to the third embodiment of the present invention taken along a line IX–IX' shown in FIG. 15A.

First, a structure of a phase shift mask 3 according to this embodiment will be described in detail with reference to the drawings. FIG. 15A is a plan view of the structure of the phase shift mask 3. FIG. 15B is a sectional view of the structure of the phase shift mask 3 taken along a line IX–IX' shown in FIG. 15A. Here, the phase shift mask 3 is used while an upper surface thereof shown in FIG. 15B is facing one side of a predetermined substrate that serves as an exposure target.

As shown in FIGS. 15A and 15B, the phase shift mask 3 has the same structure as the phase shift mask 2 of the second embodiment, except that the light interception pattern 31 in the second embodiment is omitted. Since the rest of the structure is the same as the structure of the phase shift mask 2 of the second embodiment, a detailed description thereof will be omitted here.

Moreover, in this embodiment, the structures of the third and fourth resist patterns formed by using the phase shift mask 3 are the same as the third and fourth resist patterns 23 and 24 according to the second embodiment. Furthermore, the phase difference specifying method for specifying the phase difference $\Delta\lambda$ based on the width difference $\Delta P$ thereof is the same as the phase difference specifying method according to the second embodiment. Therefore, a detailed description thereof will be omitted here.

Method of Manufacturing Phase Shift Mask 3

Figure 16A:
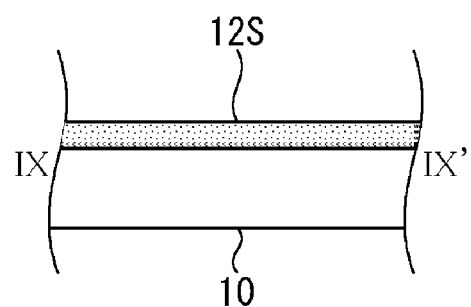
FIGS. 16A to 16C are diagrams showing processes of manufacturing the phase shift mask according to the third embodiment of the present invention.
Figure 16B:
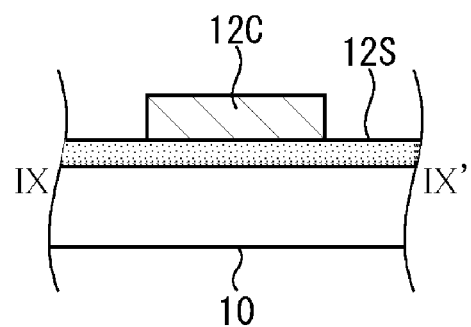
Figure 16C:
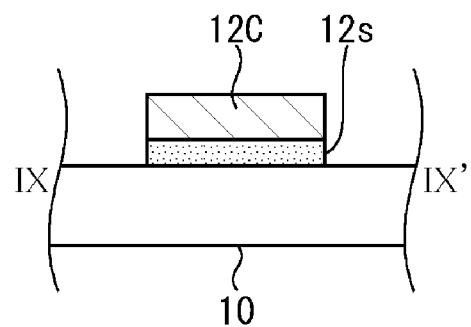

Now, a method of manufacturing the phase shift mask 3 according to this embodiment will be described in detail with reference to FIGS. 16A to 16C. FIGS. 16A to 16C are diagrams showing processes of manufacturing the phase shift mask 3. In each of FIGS. 16A to 16C, a section corresponding to the IX–IX' section in FIG. 15A under each process is illustrated.

In this manufacturing method, first, a mask substrate 10 made of glass (e.g. synthetic quartz etc.) with a thickness of 6.35 mm is prepared. Then, as shown in FIG. 16A, chrome oxide ($CrO_2$) is deposited to form a chrome oxide ($CrO_2$) film 12S on the mask substrate 10. In forming the chrome oxide ($CrO_2$) film 12S, it is possible to use a CVD (chemical vapor deposition) method, for instance. As for the thicknesses of the chrome oxide ($CrO_2$) film 12S, it can be formed to a thickness of 100 μm, for instance.

Then, after spin-coating a predetermined resist solution on the chrome oxide ($CrO_2$) film 12S, a resist pattern 12C having the same shape as the second mask pattern 12 is formed using existing exposure and development processes, as shown in FIG. 16B.

Then, using an existing etching method, for instance, the chrome oxide ($CrO_2$) film 12S is etched, while the resist patterns 12C are used as masks, to be processed into the same shapes as the second mask pattern 12, as shown in FIG. 16C. By such arrangement, the second mask pattern 12 made up of a half-tone film 12s can be obtained. Then, by removing the resist patterns 12C, the phase shift mask 3 as shown in FIG. 15A and FIG. 15B can be obtained.

Method of Manufacturing Semiconductor Device

A method of forming a semiconductor device including the exposing method using the phase shift mask 3 according to this embodiment is the same as the first embodiment of the present invention, and therefore, a redundant explanation of this manufacturing method will be omitted here.

According to the third embodiment of the present invention, by applying the structure as described above, it is possible to obtain the same types of effects as those of the second embodiment. Furthermore, according to this embodiment, since it is no longer necessary to have the light interception pattern 31 made up of a backing film, the embodiment can also be applied to a situation in which the phase shift mask as a whole is made up of a half-tone film.

In this particular embodiment, the phase shift mask 3 has multiple second mask patterns 12 formed on a single mask substrate 10. However, this is not a limiting condition in the present invention, and it is also possible to adopt a phase shift mask where only a single second mask pattern 12 is formed on the mask substrate 10, for instance. In this case, the phase shift mask may be exposed while it is shifted by a predetermined distance (e.g. Dp+Wm) when using a horizontal mask position shifting function of an exposure apparatus, for instance, in order to have the third and fourth resist patterns correspond to multiple pattern groups formed on the predetermined substrate 20.

Embodiment 4

Next, a fourth embodiment of the present invention will be described in detail with reference to the drawings. In the following, as for the structural elements that are the same as the first, second or third embodiment, the same reference numbers will be used, and redundant explanations of those structural elements will be omitted.

In this embodiment, a phase shift mask 4 according to this embodiment has the same structure as the phase shift mask 1 of the first embodiment, except that the second mask pattern 12 in the first embodiment is replaced with a Levenson type phase shift mask pattern having a phase shifter structure formed by curving the mask substrate 10.

Structure of Phase Shift Mask 4

Figure 17A:
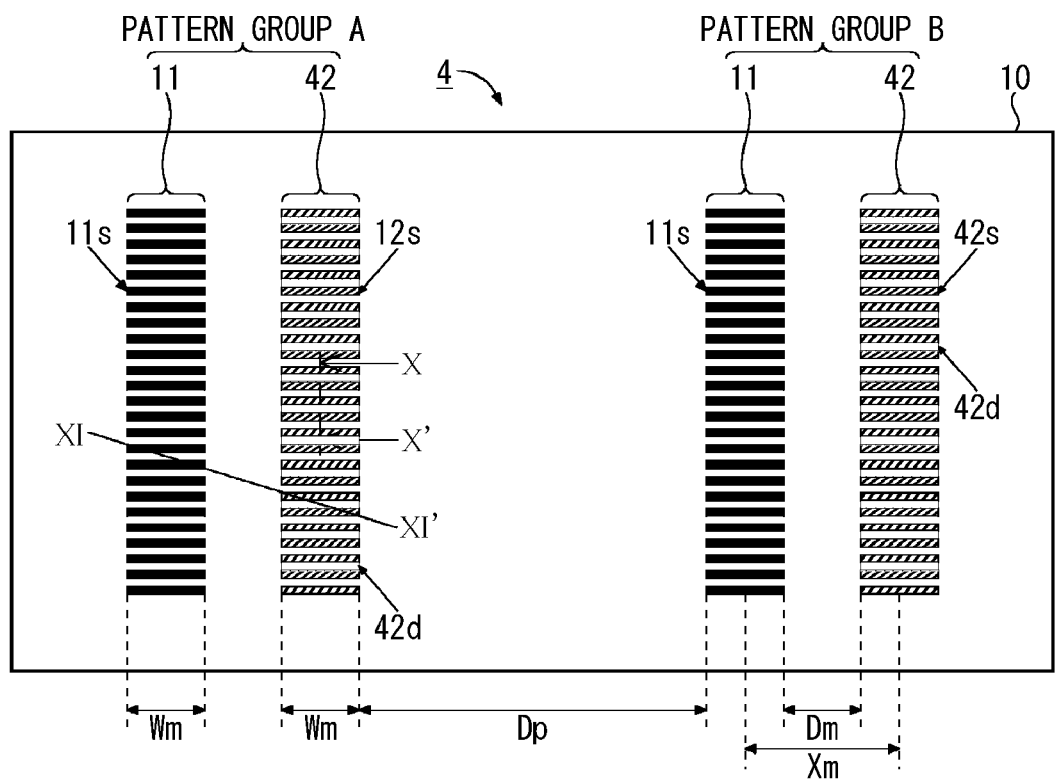
FIG. 17A is a plan view of the structure of a phase shift mask according to a fourth embodiment of the present invention.
Figure 17B:
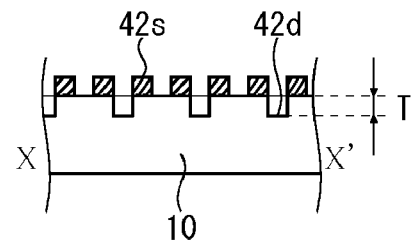
FIG. 17B is a sectional view of the structure of the phase shift mask according to the fourth embodiment of the present invention taken along a line X–X' shown in FIG. 17A.

First, the structure of a phase shift mask 4 according to this embodiment will be described in detail with reference to the drawings. FIG. 17A is a plan view of a structure of the phase shift mask 4. FIG. 17B is a sectional view of the structure of the phase shift mask 4 taken along a line X–X' shown in FIG. 17A. Here, the phase shift mask 4 is used while an upper surface thereof shown in FIG. 17B is facing one side of a predetermined substrate that serves as an exposure target.

As shown in FIGS. 17A and 17B, the phase shift mask 4 has the same structure as the phase shift mask 1 of the first embodiment, except that the second mask pattern 12 in the first embodiment is replaced with the Levenson type phase shift mask pattern 42. The size of the Levenson type phase shift mask pattern 42 is the same as the second mask pattern 12 in the first embodiment.

As shown in FIG. 17B, the Levenson type phase shift mask pattern 42 has line patterns 12s formed by half-tone films on the mask substrate 10 as with the second mask pattern 12 in the first embodiment. In addition, the Levenson type phase shift mask pattern 42 has a structure in which a trench 42d is engraved in every other interval between the line patterns 12s where the mask substrate 10 is exposed. In the Levenson type phase shift mask pattern 42, it is possible to obtain a desired phase difference Δλ by controlling the depth T of the trenches 42d.

Since the rest of the structure is the same as the structure of the phase shift mask 1 of the first embodiment, a detailed description thereof will be omitted here.

Moreover, in this embodiment, the structures of the first and second resist patterns formed by using the phase shift mask 4 are the same as the first and second resist patterns 21 and 22 according to the first embodiment. Furthermore, the phase difference specifying method for specifying the phase difference Δλ based on the width difference ΔP thereof is the same as the phase difference specifying method according to the first embodiment. Therefore, a detailed description thereof will be omitted here.

Method of Manufacturing Phase Shift Mask 4

Figure 18A:
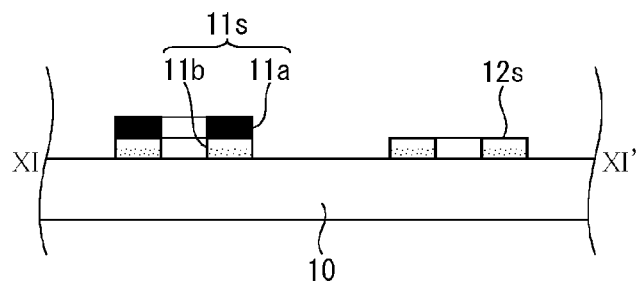
FIGS. 18A to 18C are diagrams showing processes of manufacturing the phase shift mask according to the fourth embodiment of the present invention.
Figure 18B:
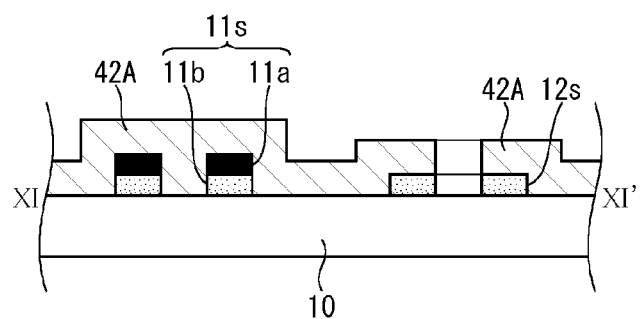
Figure 18C:
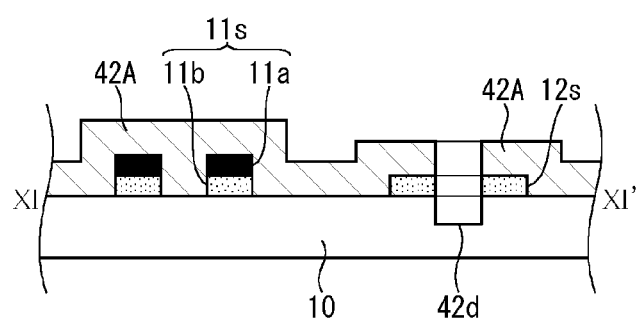

Now, a method of manufacturing the phase shift mask 4 according to this embodiment will be described in detail with reference to FIGS. 18A to 18C. FIGS. 18A to 18C are diagrams showing processes of manufacturing the phase shift mask 4. In each of FIGS. 18A to 18C, a section corresponding to the XI–XI' section in FIG. 17A under each process is illustrated.

In this manufacturing method, by using the same processes shown in FIGS. 7A to 7E, the structure shown in FIG. 18A is obtained.

Then, after spin-coating a predetermined resist solution on the mask substrate 10 having the line patterns 11s including the backing film 11a and the half-tone film 11b and the line patterns 12s including the half-tone film 11b, a resist pattern 42A having openings in every other interval between the line patterns 12s where the mask substrate 10 is exposed is formed using existing exposure and development processes, as shown in FIG. 18B.

Then, using an existing etching method, for instance, the mask substrate 10 is etched, while the resist patterns 42A are used as masks, to form the trenches in every other interval between the line patterns 12s where the mask substrate 10 is exposed, as shown in FIG. 18C. Then, by removing the resist patterns 42A, the phase shift mask 4 as shown in FIG. 17A and FIG. 17B can be obtained.

Method of Manufacturing Semiconductor Device

A method of forming a semiconductor device including the exposing method using the phase shift mask 4 according to this embodiment is the same as the first embodiment of the present invention, and therefore, a redundant explanation of this manufacturing method will be omitted here.

According to the fourth embodiment of the present invention, by applying the structure as described above, it is possible to obtain the same types of effects as those of the first embodiment by use of the Levenson type phase shift mask.

In this particular embodiment, the phase shift mask 4 has multiple pattern groups (i.e., the pattern groups A and B in this embodiment) formed on a single mask substrate 10. However, this is not a limiting condition in the present invention, and it is also possible to adopt a phase shift mask where only a single pattern group (e.g. the pattern group A) is formed on the mask substrate 10, for instance. In this case, the phase shift mask may be exposed while it is shifted by a predetermined distance (e.g. Dp+Wm) when using a horizontal mask position shifting function of an exposure device, for instance, in order to have the first and second resist patterns correspond to multiple pattern groups formed on the predetermined substrate 20.

According to this embodiment, the Levenson type phase shift mask pattern has a structure in which the trench 42d is engraved in every other interval between the line patterns 12s where the mask substrate 10 is exposed. However, this is not a limiting condition in the present invention, and various other Levenson type phase shift mask patterns are possible options. For instance, it is possible to adopt a type of Levenson type phase shift mask pattern having a structure in which a semi-transmissive film or a backing film with a different refraction index from the line pattern 12*s* is formed in each exposed portion of the mask substrate 10 between the line patterns 12*s*.

Embodiment 5

Next, a fifth embodiment of the present invention will be described in detail with reference to the drawings. In the following, the same reference numbers will be used for the structural elements that are the same as the first, second or third embodiment, and redundant explanations of those structural elements will be omitted.

In this embodiment, a phase shift mask 5 according to this embodiment has the same structure as the phase shift mask 2 or 3 of the second or third embodiment, except that the second mask pattern 12 in the second or third embodiment is replaced with a Levenson type phase shift mask pattern having a phase shifter structure formed by curving the mask substrate 10. In the following, a situation in which the second mask pattern 12 of the phase shift mask 2 in the second embodiment is replaced with the Levenson type phase shift mask pattern will be described as an example.

Structure of Phase Shift Mask 5

Figure 19A:
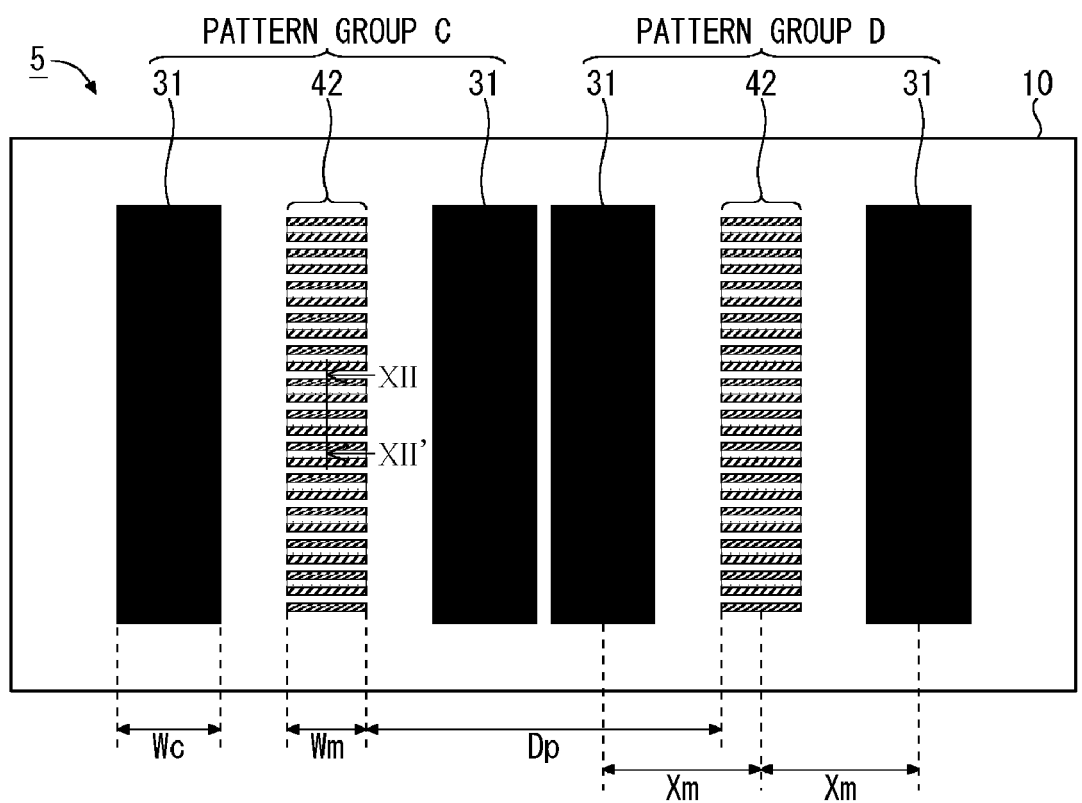
FIG. 19A is a plan view of the structure of a phase shift mask according to a fifth embodiment of the present invention.
Figure 19B:
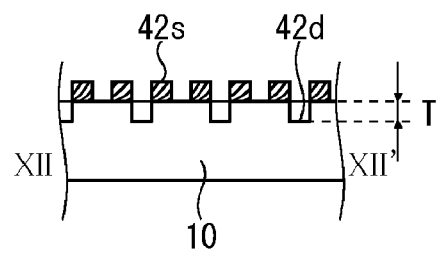
FIG. 19B is a sectional view of the structure of the phase shift mask according to the fifth embodiment of the present invention taken along a line XII–XII' shown in FIG. 19A.

First, the structure of a phase shift mask 5 according to this embodiment will be described in detail with reference to the drawings. FIG. 19A is plan view of the structure of the phase shift mask 5. FIG. 19B is a sectional view of the structure of the phase shift mask 5 taken along a line XII–XII' shown in FIG. 19A. Here, the phase shift mask 5 is used while an upper surface thereof shown in FIG. 19B is facing one side of a predetermined substrate that serves as an exposure target.

As shown in FIGS. 19A and 19B, the phase shift mask 5 has the same structure as the phase shift mask 2 of the second embodiment, except that the second mask pattern 12 in the second embodiment is replaced with the Levenson type phase shift mask pattern 42. The size of the Levenson type phase shift mask pattern 42 is the same as the Levenson type phase shift mask pattern 42 in the fourth embodiment. Since the rest of the structure is the same as the structure of the phase shift mask 2 of the second embodiment, a detailed description thereof will be omitted here.

Moreover, in this embodiment, the structures of the third and fourth resist patterns formed by using the phase shift mask 5 are the same as the third and fourth resist patterns 23 and 24 according to the second embodiment. Furthermore, the phase difference specifying method for specifying the phase difference $\Delta\lambda$ based on the width difference $\Delta P$ thereof is the same as the phase difference specifying method according to the second embodiment. Therefore, a detailed description thereof will be omitted here.

Method of Manufacturing Phase Shift Mask 5

A method of forming the phase shift mask 5 according to this embodiment can be obtained by combining the method of forming the phase shift mask 2 according to the second embodiment and the method of forming the phase shift mask 4 according to the fourth embodiment, and therefore, a redundant explanation of this manufacturing method will be omitted here.

Method of Manufacturing Semiconductor Device

A method of forming a semiconductor device including the exposing method using the phase shift mask 5 according to this embodiment is the same as the first embodiment of the present invention, and therefore, a redundant explanation of this manufacturing method will be omitted here.

According to the fifth embodiment of the present invention, by applying the structure as described above, it is possible to obtain the same types of effects as those of the second and third embodiments by use of the Levenson type phase shift mask.

In this particular embodiment, the phase shift mask 5 has multiple Levenson type phase shift mask patterns 42 formed on a single mask substrate 10. However, this is not a limiting condition in the present invention, and it is also possible to adopt a phase shift mask where only a single Levenson type phase shift mask pattern 42 is formed on the mask substrate 10, for instance. In this case, the phase shift mask may be exposed while it is shifted by a predetermined distance (e.g. Dp+Wm) when using a horizontal mask position shifting function of an exposure device, for instance, in order to have the third and fourth resist patterns correspond to multiple pattern groups formed on the predetermined substrate 20.

According to this embodiment, as with the case of the fourth embodiment, the Levenson type phase shift mask pattern has a structure in which a trench 42*d* is engraved in every other interval between the line patterns 12*s* where the mask substrate 10 is exposed. However, this is not a limiting condition in the present invention, and various other Levenson type phase shift mask patterns are possible options. For instance, it is possible to adopt a type of Levenson type phase shift mask pattern having a structure in which a semi-transmissive film or a backing film with a different refraction index from the line pattern 12*s* is formed in each exposed portion of the mask substrate 10 between the line patterns 12*s*.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-164371. The entire disclosures of Japanese Patent Application No. 2005-164371 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A phase difference specifying method comprising:
   preparing a phase shift mask having a first mask pattern and a second mask pattern, the first mask pattern comprising a backing film having a first shape which enables a first optical image to be formed on a predetermined substrate that is a target of exposure, the first optical image capable of forming a first resist pattern having a first width that changes depending on a distance from the predetermined substrate, the second mask pattern comprising a semi-transmissive film having a second shape which enables a second optical image to be formed on the predetermined substrate, the second optical image capable of forming a second resist pattern having a second width that changes depending on a distance from the predetermined substrate and on a thickness of the semi-transmissive film, the first mask pattern and the second mask pattern being separated from each other by a first interval;
   forming the first and second resist patterns on the predetermined substrate by exposing the predetermined substrate to light through the phase shift mask, the phase shift mask being arranged at a first position on a predetermined optical axis separated from the predetermined substrate by a first distance;
   obtaining the difference between the first width of the first resist pattern and the second width of the second resist pattern; and
   obtaining the difference between the phases of a first light passing through the phase shift mask except for regions where the first and second mask patterns are formed, and a second light passing through the second mask pattern, based on the width difference between the first resist pattern and the second resist pattern.

2. The phase difference specifying method according to claim 1, wherein
   the first position is a position on the predetermined optical axis separated from a second position by a second distance, the second position being a position where the first and second optical images are formed on the predetermined substrate in focus.

3. The phase difference specifying method according to claim 1, wherein
   the phase difference between the first light and the second light is specified by using a correspondence relationship between the width difference and the phase difference which is registered in advance.

4. The phase difference specifying method according to claim 1, wherein
   at least two combinations of the first and second resist patterns are formed on the predetermined substrate, a width direction of the first resist patterns being the same as a width direction of the second resist patterns, and
   the width difference is calculated based on the center between an exterior edge of one first resist pattern and an exterior edge of one second resist pattern and the center between an interior edge of the other first resist pattern and an interior edge of the other second resist pattern, one first resist pattern being located at one external side in the width direction, the other first resist pattern being located at an internal side in the width direction, one second resist pattern being located at the other external side in the width direction, and the other second resist pattern located at an internal side in the width direction.

5. The phase difference specifying method according to claim 1, wherein
   the phase shift mask has at least two combinations of the first and second mask patterns, the combinations having a second interval therebetween, and
   the width direction of the first and second mask patterns in one combination is the same as the width direction of the first and second mask patterns in the other combination.

6. The phase difference specifying method according to claim 1, wherein
   the first and second shapes are line-and-space patterns.

7. The phase difference specifying method according to claim 1, wherein
   a duty ratio of the second shape is set so that a change in the width of the first optical image with respect to the first distance will be equal to a change in the width of the second optical image with respect to the change of the first distance when the thickness of the semi-transmissive film is set so that the phase difference becomes 180°.

8. The phase difference specifying method according to claim 1, wherein
   the backing film is made of chrome.

9. The phase difference specifying method according to claim 1, wherein
   the semi-transmissive film is a chromium oxide film, a molybdenum silicide oxide film, or a multilayer film including at least one of a chromium oxide film and a molybdenum silicide oxide film.

10. The phase difference specifying method according to claim 1, wherein
    the second mask pattern is a Levenson type phase shift mask.

11. A phase difference specifying method comprising:
    preparing a phase shift mask having a mask pattern comprising a semi-transmissive film having a shape which enables an optical image to be formed on a predetermined substrate that is a target of exposure, the optical image capable of forming a resist pattern having a width that changes depending on a distance from the predetermined substrate;
    forming a first resist pattern on the predetermined substrate by exposing the predetermined substrate through the phase shift mask, the phase shift mask being arranged at a first position on a predetermined optical axis separated from the predetermined substrate by a first distance;
    forming a second resist pattern on the predetermined substrate by exposing the predetermined substrate through the phase shift mask, the phase shift mask being arranged at a second position which is separated from the predetermined optical axis by a first interval in a direction perpendicular to the predetermined optical axis and from the predetermined substrate by a second distance;
    obtaining the difference between the first width of the first resist pattern and the second width of the second resist pattern; and
    obtaining the difference between the phases of a first light passing through the phase shift mask except for regions where the mask pattern is formed and a second light passing through the mask pattern, based on the width difference between the first resist pattern and the second resist pattern.

12. The phase difference specifying method according to claim 11, wherein
the first position is a position on the predetermined optical axis separated from a third position by a third distance, the third position being a position where the optical images are formed on the predetermined substrate in focus, and
the second position is a position on the predetermined optical axis separated from the third position by the third distance, the third position existing between the first and second positions.

13. The phase difference specifying method according to claim 11, wherein
the phase difference between the first light and the second light is specified by using a correspondence relationship between the width difference and the phase difference which is registered in advance.

14. The phase difference specifying method according to claim 11, wherein
at least two combinations of the first and second resist pattern are formed on the predetermined substrate, a width direction of the first resist patterns being the same as a width direction of the second resist patterns, and
the width difference is calculated based on the center between an exterior edge of one first resist pattern and an exterior edge of one second resist pattern and the center between an interior edge of the other first resist pattern and an interior edge of the other second resist pattern, one first resist pattern being located at one external side in the width direction, the other first resist pattern being located at an internal side in the width direction, one second resist pattern being located at the other external side in the width direction, and the other second resist pattern located at an internal side in the width direction.

15. The phase difference specifying method according to claim 11, wherein
the phase shift mask has at least two mask patterns which have a second interval therebetween, and
a width direction of one mask pattern is the same as a width direction of the other mask pattern.

16. The phase difference specifying method according to claim 11, wherein
the shape of the mask pattern is a line-and-space pattern.

17. The phase difference specifying method according to claim 11, wherein
the semi-transmissive film is a chromium oxide film, a molybdenum silicide oxide film, or a multilayer film including at least one of a chromium oxide film and a molybdenum silicide oxide film.

18. The phase difference specifying method according to claim 11, wherein
the phase shift mask has a backing film which is larger than the mask pattern formed on a position separated from the mask pattern by the first interval in a direction perpendicular to the predetermined optical axis, and
the shadow of the backing film covers the first resist pattern formed on the predetermined substrate when forming the second resist pattern.

19. The phase difference specifying method according to claim 18, wherein
the backing film is made of chrome.

20. The phase difference specifying method according to claim 11, wherein
the mask pattern is a Levenson type phase shift mask.

* * * * *